United States Patent
Kang et al.

(10) Patent No.: US 12,424,559 B2
(45) Date of Patent: Sep. 23, 2025

(54) PACKAGE WITH A SUBSTRATE COMPRISING EMBEDDED ESCAPE INTERCONNECTS AND SURFACE ESCAPE INTERCONNECTS

(71) Applicant: QUALCOMM Incorporated, San Diego, CA (US)

(72) Inventors: Kuiwon Kang, San Diego, CA (US); Hong Bok We, San Diego, CA (US); Michelle Yejin Kim, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 795 days.

(21) Appl. No.: 17/684,327

(22) Filed: Mar. 1, 2022

(65) Prior Publication Data
US 2023/0282585 A1    Sep. 7, 2023

(51) Int. Cl.
*H01L 23/538*    (2006.01)
*H01L 21/48*    (2006.01)

(52) U.S. Cl.
CPC ...... *H01L 23/5381* (2013.01); *H01L 21/4853* (2013.01); *H01L 21/4857* (2013.01); *H01L 23/5383* (2013.01); *H01L 23/5386* (2013.01)

(58) Field of Classification Search
CPC ............. H01L 23/5381; H01L 21/4853; H01L 21/4857; H01L 23/5383; H01L 23/528; H01L 23/5386; H01L 23/49816; H01L 27/0207; H05K 3/4682; H05K 2201/09227; H05K 2201/10378; H05K 2201/10522; H05K 2201/10734; H05K 1/111
See application file for complete search history.

(56) References Cited

U.S. PATENT DOCUMENTS

| | | | |
|---|---|---|---|
| 2015/0061143 A1* | 3/2015 | Kim | H01L 23/528 438/618 |
| 2016/0141234 A1 | 5/2016 | We et al. | |
| 2018/0158771 A1 | 6/2018 | Akiba et al. | |
| 2019/0122974 A1* | 4/2019 | Goh | H01L 23/31 |
| 2021/0082822 A1 | 3/2021 | Aleksov et al. | |
| 2021/0082825 A1* | 3/2021 | Strong | H01L 23/5389 |
| 2021/0307172 A1* | 9/2021 | Darmawikarta | H05K 1/116 |
| 2022/0068662 A1* | 3/2022 | Fang | H01L 21/4857 |

OTHER PUBLICATIONS

International Search Report and Written Opinion—PCT/US2023/062402—ISA/EPO—May 10, 2023.

* cited by examiner

*Primary Examiner* — Yasser A Abdelaziz
(74) *Attorney, Agent, or Firm* — Loza & Loza, LLP

(57) ABSTRACT

A package that includes a substrate, a first integrated device coupled to the substrate, and a second integrated device coupled to the substrate. The substrate includes at least one dielectric layer, and a plurality of interconnects comprising a plurality of escape interconnects. The plurality of escape interconnects includes a first embedded escape interconnect, a second embedded escape interconnect, and a third escape interconnect located between the first embedded escape interconnect and the second embedded escape interconnect.

23 Claims, 15 Drawing Sheets

C-C PROFILE CROSS SECTIONAL VIEW

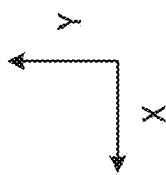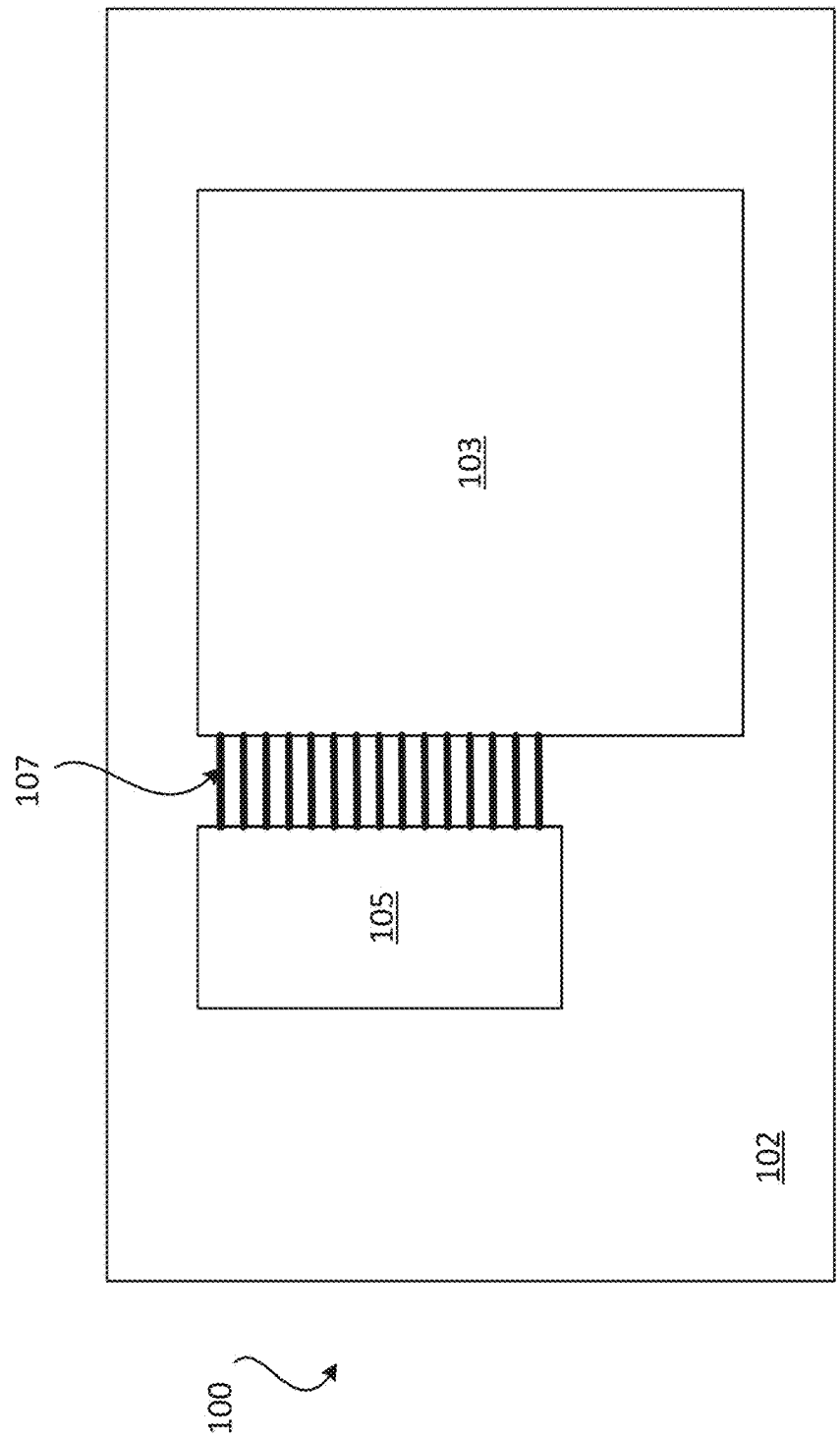
PLAN VIEW
*FIG. 1*

PLAN VIEW

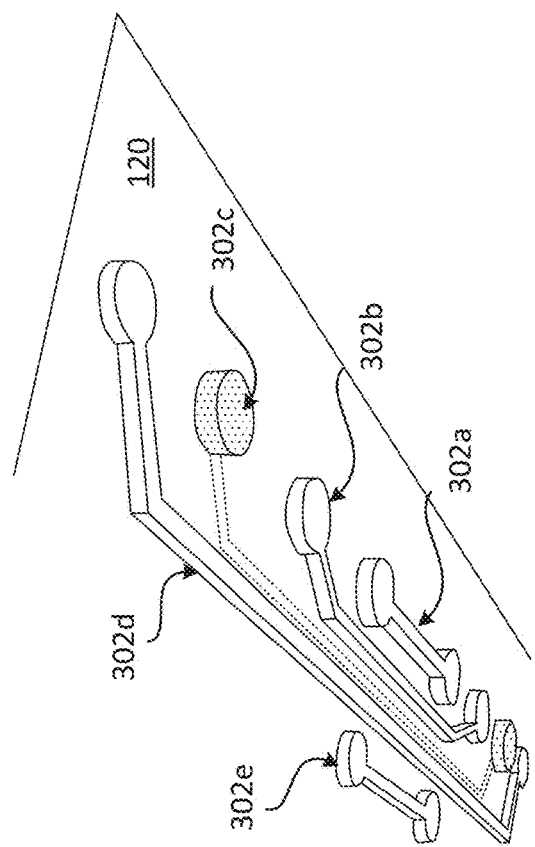
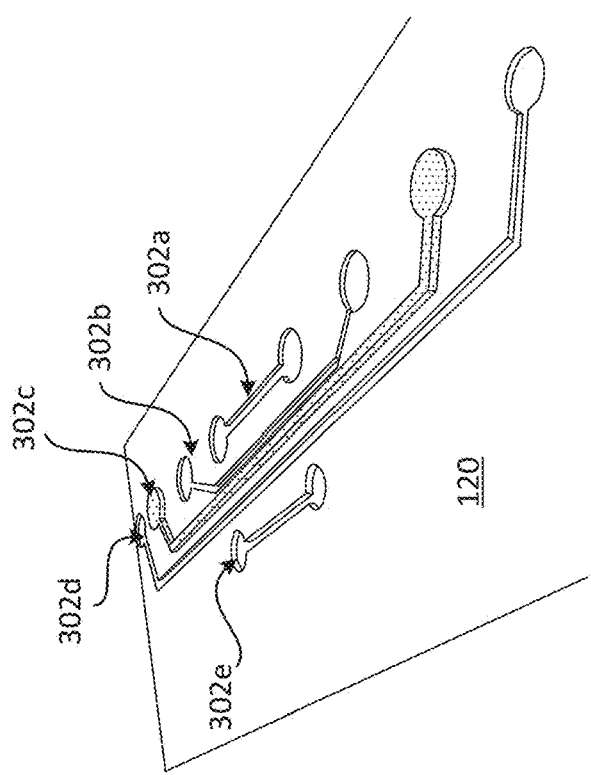
TOP VIEW
*FIG. 3*
BOTTOM VIEW
*FIG. 4*

B-B PROFILE CROSS SECTIONAL VIEW

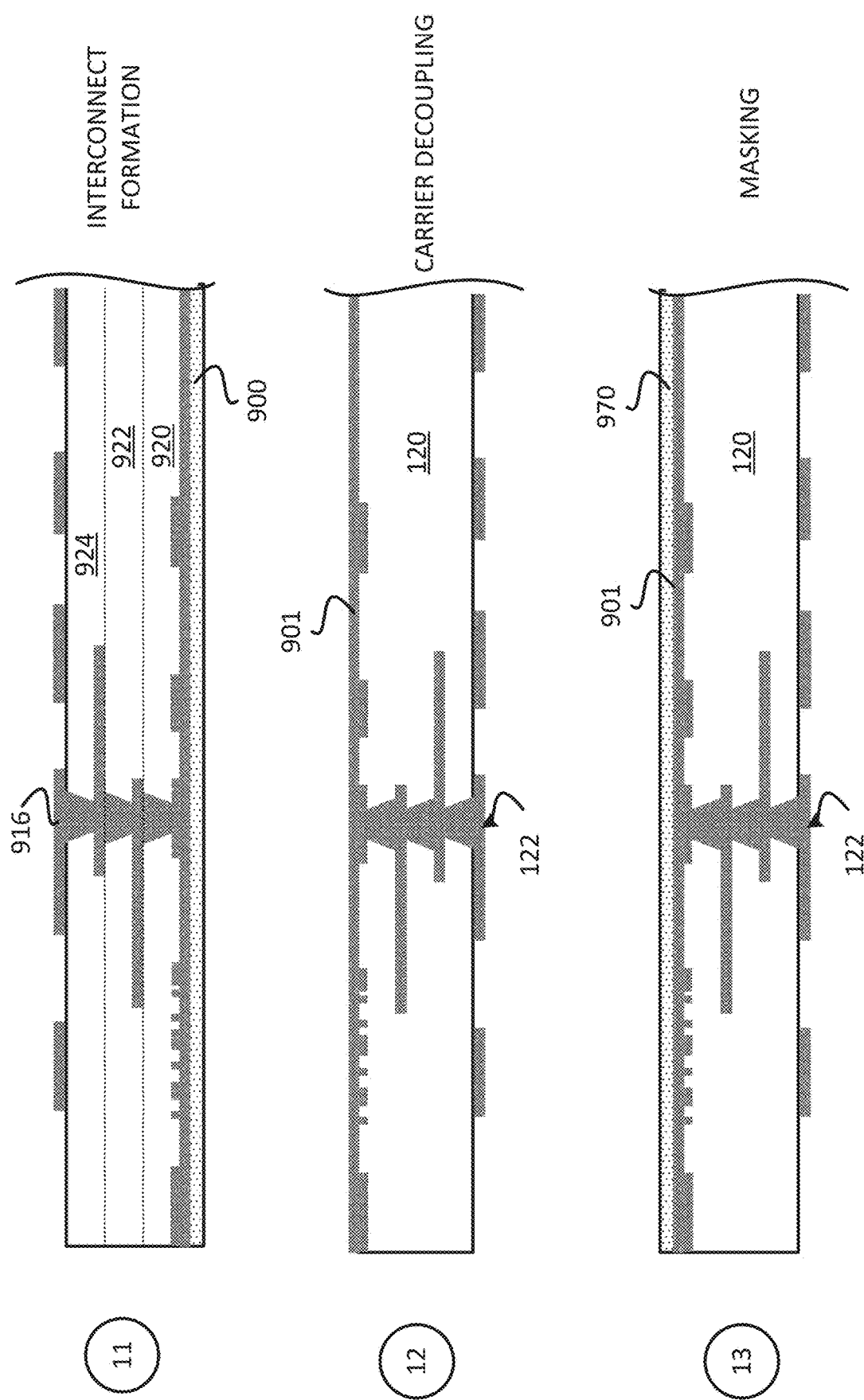

PACKAGE WITH A SUBSTRATE COMPRISING EMBEDDED ESCAPE INTERCONNECTS AND SURFACE ESCAPE INTERCONNECTS

FIELD

Various features relate to packages that include an integrated device, but more specifically to a package that includes an integrated device and a substrate.

BACKGROUND

Packages can include a substrate and an integrated device. The substrate may include a plurality of interconnects. The integrated device may be coupled to interconnects of the substrate. There is an ongoing need to provide smaller packages with higher density interconnects between the substrate and the integrated device.

SUMMARY

Various features relate to packages that include an integrated device, but more specifically to a package that includes an integrated device and a substrate.

One example provides a package that includes a substrate, a first integrated device coupled to the substrate, and a second integrated device coupled to the substrate. The substrate includes at least one dielectric layer, and a plurality of interconnects comprising a plurality of escape interconnects. The plurality of escape interconnects includes a first embedded escape interconnect, a second embedded escape interconnect, and a third escape interconnect located between the first embedded escape interconnect and the second embedded escape interconnect.

Another example provides a package comprising a substrate, a first integrated device coupled to the substrate, and a second integrated device coupled to the substrate. The substrate includes at least one dielectric layer, means for first embedded escape interconnection, means for second embedded escape interconnection, and means for surface escape interconnection, wherein the means for surface escape interconnection is located between the means for first embedded escape interconnection and the means for second embedded escape interconnection.

Another example provides a method for fabricating a package. The method provides a substrate comprising: at least one dielectric layer; a plurality of interconnects comprising a plurality of escape interconnects, wherein the plurality of escape interconnects comprises: a first embedded escape interconnect; a second embedded escape interconnect; and a third escape interconnect located between the first embedded escape interconnect and the second embedded escape interconnect. The method couples a first integrated device to the substrate. The method couples a second integrated device to the substrate.

BRIEF DESCRIPTION OF THE DRAWINGS

Various features, nature and advantages may become apparent from the detailed description set forth below when taken in conjunction with the drawings in which like reference characters identify correspondingly throughout.

FIG. 1 illustrates a plan view of a package that includes integrated devices and a substrate with escape interconnects.

FIG. 3 illustrates an angled view of a substrate with embedded escape interconnects and surface escape interconnects.

FIG. 4 illustrates another angled view of a substrate with embedded escape interconnects and surface escape interconnects.

FIGS. 9A-9D illustrate an exemplary sequence for fabricating a substrate with escape interconnects.

DETAILED DESCRIPTION

Figure 2:
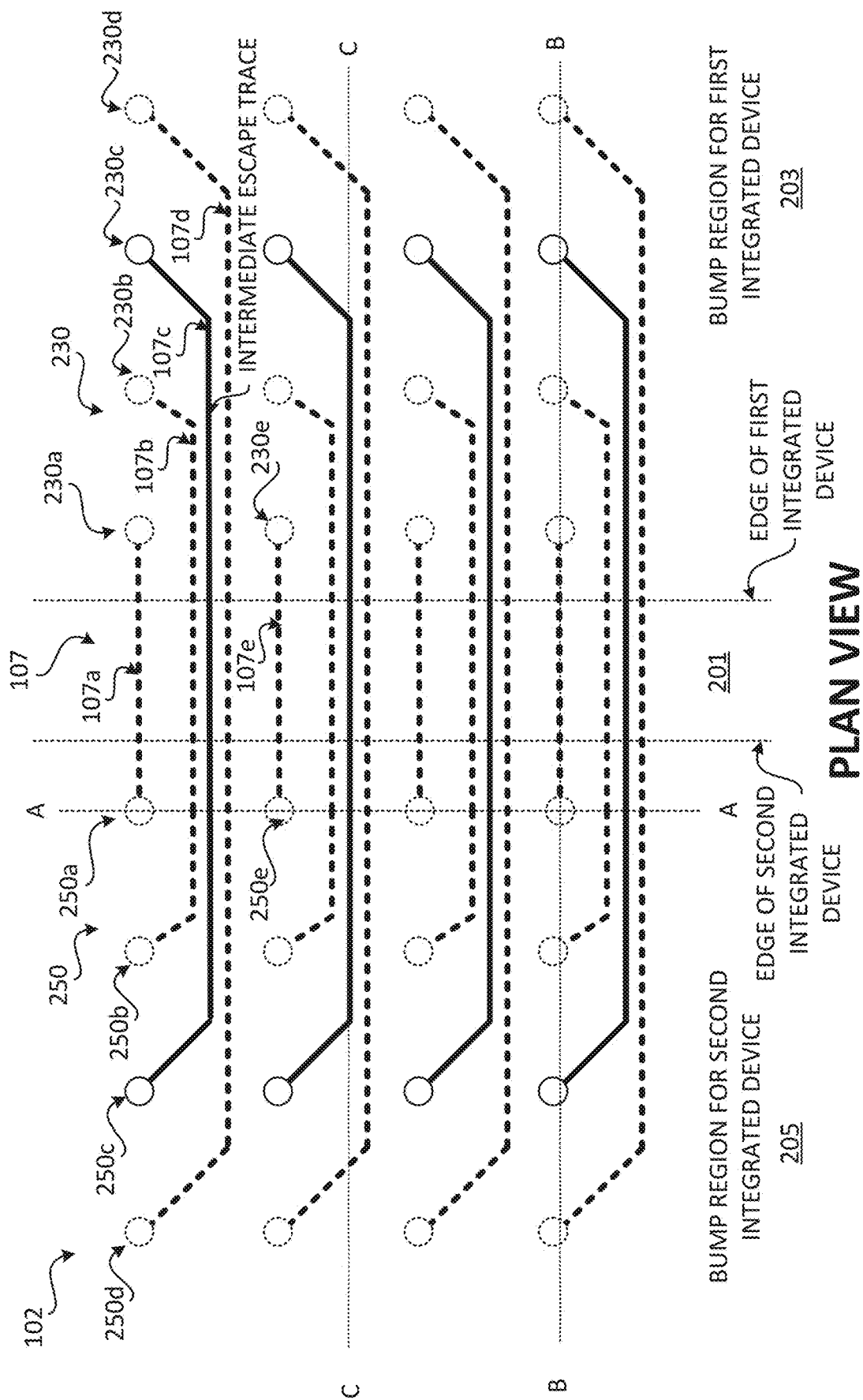
FIG. 2 illustrates a plan view of a substrate with embedded escape interconnects and surface escape interconnects.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate, a first integrated device coupled to the substrate, and a second integrated device coupled to the substrate. The substrate includes at least one dielectric layer, and a plurality of interconnects comprising a plurality of escape interconnects. The plurality of escape interconnects includes a first embedded escape interconnect, a second embedded escape interconnect, and a third escape interconnect located between the first embedded escape interconnect and the second embedded escape interconnect. The third escape interconnect is located on a different layer than the first the first embedded escape interconnect and the second embedded escape interconnect. The third escape interconnect may be a surface escape interconnect. The third escape interconnect may be embedded in a solder resist layer. The third escape interconnect may be an intermediate interconnect between the first embedded escape interconnect and the second embedded escape interconnect. The first embedded escape interconnect and the second embedded escape interconnect may be located in the at least one dielectric layer of the substrate. The use of the first embedded escape interconnect, the second embedded escape interconnect and the third escape interconnects helps provide improved yields in the fabrication of a substrate, which helps reduce the overall cost of the substrate and the package, while providing high-density escape interconnects between two or more integrated devices coupled to a substrate. The use of the escape interconnects may help provide smaller packages.

Exemplary Package Comprising a Substrate Comprising Escape Interconnects

FIG. 1 illustrates a plan view of a package 100 that includes a substrate with escape interconnects. The package 100 includes a substrate 102, an integrated device 103, and integrated device 105. The substrate 102 includes a plurality of escape interconnects 107. The integrated device 103 (e.g., first integrated device) and the integrated device 105 (e.g., second integrated device) may be configured to be electrically coupled to one another through the plurality of escape interconnects 107 of the substrate 102. The plurality of escape interconnects 107 may provide a plurality of electrical paths between the integrated device 103 and the integrated device 105. For example, the plurality of escape interconnects 107 may provide a plurality of electrical paths for input/output (I/O)) signals/currents between the integrated device 103 and the integrated device 105. As will be further described below in at least FIG. 2, the plurality of escape interconnects 107 may include embedded escape interconnects and surface escape interconnects. A surface escape interconnect may be an intermediate escape interconnect between two embedded escape interconnects. The plurality of escape interconnects 107 may be configured as bridge interconnects (e.g., bridge escape interconnects) between the integrated device 103 and the integrated device 105. The plurality of escape interconnects 107 may include a means for embedded escape interconnection (e.g., a means for first embedded escape interconnection, a means for second embedded escape interconnection) and a means for surface escape interconnection.

As will be further described below in at least FIG. 5, the substrate 102 includes at least one dielectric layer 120, a plurality of interconnects 122, a solder resist layer 140, and a solder resist layer 142. The plurality of escape interconnects 107 may be part of the plurality of interconnects 122 of the substrate 102.

FIG. 2 illustrates a plan cross sectional view of a portion of the substrate 102. The substrate 102 includes a region 201, a first bump region 203 for a first integrated device (e.g., integrated device 103) and a second bump region 205 for a second integrated device (e.g., integrated device 105). A bump region may be a region of the substrate where solder interconnects and/or pillar interconnects from an integrated device may be coupled to interconnects of the substrate. For example, the first bump region 203 may be a region of the substrate 102 where solder interconnects (e.g., 132) and/or pillar interconnects (e.g., 130) may be coupled to the plurality of interconnects 230. In another example, the second bump region 205 may be a region of the substrate 102 where solder interconnects (e.g., 152) and/or pillar interconnects (e.g., 150) may be coupled to the plurality of interconnects 250.

The region 201 may be part of an escape region for the substrate 102. The region 201 of the substrate 102 may be located between the edge (e.g., first edge) of a first integrated device (e.g., 103) and the edge (e.g., second edge) of a second integrated device (e.g., 105). The first edge of a first integrated device (e.g., 103) and the second edge of a second integrated device (e.g., 105) may be parallel to each other. The first edge of a first integrated device (e.g., 103) may face the second edge of a second integrated device (e.g., 105), and vice versa. The region 201, the first bump region 203, and the second bump region 205 are regions of the substrate 102 that include escape interconnects. The substrate 102 includes a plurality of escape interconnects 107, a plurality of interconnects 230 and a plurality of interconnects 250. As will be further described below in at least FIG. 5, the plurality of escape interconnects 107, the plurality of interconnects 230 and the plurality of interconnects 250 may be considered part of the plurality of interconnects 122 of the substrate 102.

The plurality of interconnects 230 includes an interconnect 230a, an interconnect 230b, an interconnect 230c, an interconnect 230d, and an interconnect 230e. The plurality of interconnects 230 may include pad interconnects (e.g., pads). The interconnect 230a, the interconnect 230b, the interconnect 230d and the interconnect 230e may be embedded interconnects (e.g., embedded pad interconnects) in the dielectric layer of the substrate 102. The interconnect 230c may be a surface interconnect (e.g., surface pad interconnect) located over the dielectric layer of the substrate 102. The interconnect 230c may be covered by a solder resist layer. The plurality of interconnects 230 may be coupled to solder interconnects (e.g., 132) and/or pillar interconnects of an integrated device (e.g., 103).

The plurality of interconnects 250 includes an interconnect 250a, an interconnect 250b, an interconnect 250c, an interconnect 250d, and an interconnect 250e. The plurality of interconnects 250 may include pad interconnects (e.g., pads). The interconnect 250a, the interconnect 250b, the interconnect 250d and the interconnect 250e may be embedded interconnects (e.g., embedded pad interconnects) in the dielectric layer of the substrate 102. The interconnect 250c may be a surface interconnect (e.g., surface pad interconnect) located over the dielectric layer of the substrate 102. The interconnect 250c may be covered by a solder resist layer. The plurality of interconnects 250 may be coupled to solder interconnects (e.g., 152) and/or pillar interconnects of an integrated device (e.g., 105).

The plurality of escape interconnects 107 include an escape interconnect 107a, an escape interconnect 107b, an escape interconnect 107c, an escape interconnect 107d and an escape interconnect 107e. The plurality of escape interconnects 107 may include escape trace interconnects (e.g., escape traces). The escape interconnect 107a, the escape interconnect 107b, the escape interconnect 107d, and the escape interconnect 107e may be embedded escape interconnects (e.g., embedded escape trace interconnects). The escape interconnect 107a, the escape interconnect 107b, the escape interconnect 107d, and the escape interconnect 107e may be examples of means for embedded escape interconnection (e.g., a means for first embedded escape interconnection, a means for second embedded escape interconnection). The escape interconnect 107c may be a surface escape interconnect (e.g., surface escape trace interconnect) located over the dielectric layer of the substrate 102. The escape interconnect 107c may be covered by a solder resist layer. The escape interconnect 107c may be an example of a means for surface escape interconnection. The escape interconnect 107c may be considered as an intermediate escape interconnect (e.g., intermediate escape trace interconnect) between two neighboring embedded escape interconnects (e.g., 107b, 107d). The escape interconnect 107c may be considered between the escape interconnect 107b and the escape interconnect 107d, even if portions of the escape interconnect 107c may be located on a different metal layer than the escape interconnect 107b and the escape interconnect 107d. At least a portion of the escape interconnect 107c (e.g., surface escape interconnect) is adjacent and parallel to at least a portion of a first embedded interconnect (e.g., escape interconnect 107b) and is also adjacent and parallel to at least a portion of a second embedded interconnect (e.g., escape interconnect 107d). The first embedded interconnect (e.g., escape interconnect 107b) may face a first side of the surface escape interconnect (e.g., 107c), and the second embedded interconnect (e.g., escape interconnect 107d) may face a second side of the surface escape interconnect (e.g., 107c). The escape interconnect 107b and the escape interconnect 107d may be considered adjacent embedded escape interconnects with a surface interconnect (e.g., escape interconnect 107c) between them. The spacing between the escape interconnect 107c and the escape interconnect 107b may be smaller than the spacing between the escape interconnect 107d and the escape interconnect 107b. Similarly, the spacing between the escape interconnect 107c and the escape interconnect 107d may be smaller than the spacing between the escape interconnect 107d and the escape interconnect 107b. In some implementations, the substrate 102 may include several repeating configurations of a first embedded escape interconnect, a surface escape interconnect and a second embedded escape interconnect, as shown in FIG. 2.

The escape interconnect 107a is coupled to the interconnect 230a and the interconnect 250a. The escape interconnect 107b is coupled to the interconnect 230b and the interconnect 250b. The escape interconnect 107c is coupled to the interconnect 230c and the interconnect 250c. The escape interconnect 107d is coupled to the interconnect 230d and the interconnect 250d. The escape interconnect 107e is coupled to the interconnect 230e and the interconnect 250e.

The escape interconnect 107b, the escape interconnect 107c, and the escape interconnect 107d may be located and/or extend between the interconnect 230a and the interconnect 230e. The escape interconnect 107b, the escape interconnect 107c, and the escape interconnect 107d may be located and/or extend between the interconnect 250a and the interconnect 250e. Part of the escape interconnect 107b, part of the escape interconnect 107c and part of the escape interconnect 107d are parallel to one another. For example, part of the escape interconnect 107b, part of the escape interconnect 107c and part of the escape interconnect 107d that are located in the region 201 may be parallel to one another.

The escape interconnect 107a, the escape interconnect 107b, the escape interconnect 107d and the escape interconnect 107e may be located on a metal layer (e.g., first metal layer, second metal layer), and the escape interconnect 107c may be located on another metal layer (e.g., first metal layer, second metal layer) that is different than the metal layer on which the escape interconnect 107a, the escape interconnect 107b, the escape interconnect 107d and the escape interconnect 107e are located on. An escape interconnect, such as an embedded escape interconnect and/or a surface escape interconnect may be an interconnect that is configured to provide an electrical path between two adjacent integrated devices coupled to a surface (e.g., first surface, second surface) of a substrate.

The width of the escape interconnect 107a, the escape interconnect 107b, the escape interconnect 107c, the escape interconnect 107d and the escape interconnect 107e may be in a range of about 10-15 micrometers. The spacing(S) between the escape interconnect 107b and the escape interconnect 107c may be in a range of about 10-15 micrometers. For example, the spacing(S) between the escape interconnect 107b and the escape interconnect 107c in the region 201 of the substrate 102, may be in a range of about 10-15 micrometers. In another example, the spacing(S) between the escape interconnect 107b and the escape interconnect 107c in the region between the interconnect 230a and the interconnect 230e, may be in a range of about 10-15 micrometers. In another example, the spacing(S) between the escape interconnect 107b and the escape interconnect 107c in the region between the interconnect 250a and the interconnect 250e, may be in a range of about 10-15 micrometers. The spacing(S) between the escape interconnect 107c and the escape interconnect 107d may be in a range of about 10-15 micrometers. For example, the spacing (S) between the escape interconnect 107c and the escape interconnect 107d in the region 201 of the substrate 102, may be in a range of about 10-15 micrometers. In another example, the spacing(S) between the escape interconnect 107c and the escape interconnect 107d in the region between the interconnect 230a and the interconnect 230e, may be in a range of about 10-15 micrometers. In another example, the spacing(S) between the escape interconnect 107c and the escape interconnect 107d in the region between the interconnect 250a and the interconnect 250e, may be in a range of about 10-15 micrometers. In some implementations, the values of the spacing(S) described above may be minimum spacing values. Thus, for example, the above escape interconnects may have a minimum spacing in a range of about 10-15 micrometers. Therefore, in some implementations, the above escape interconnects may have a spacing value that is greater than 15 micrometers. In some implementations, the values of the width described above may be minimum width values. Thus, for example, the above escape interconnects may have a minimum width in a range of about 10-15 micrometers. Therefore, in some implementations, the above escape interconnects may have a width value that is greater than 15 micrometers.

FIG. 2 illustrates several repeating patterns/configurations/arrangements of interconnects (e.g., escape interconnects) between two integrated devices. For example, a first configuration of interconnects may include the escape interconnect 107a, the escape interconnect 107b, the escape interconnect 107c, and the escape interconnect 107d. It is noted that the first configuration of interconnects may also include the interconnect 230a, the interconnect 230b, the interconnect 230c, the interconnect 230d, the interconnect 250a, the interconnect 250b, the interconnect 250c, and/or the interconnect 250d.

A second configuration of interconnects may include escape interconnects arranged in a similar manner as the escape interconnect 107a, the escape interconnect 107b, the escape interconnect 107c, and the escape interconnect 107d. The second configuration of interconnects may include interconnects arranged in a similar manner as the escape interconnect 107a, the escape interconnect 107b, the escape interconnect 107c, the escape interconnect 107d, the interconnect 230a, the interconnect 230b, the interconnect 230c, the interconnect 230d, the interconnect 250a, the interconnect 250b, the interconnect 250c, and/or the interconnect 250d.

A third configuration of interconnects may include escape interconnects arranged in a similar manner as the escape interconnect 107a, the escape interconnect 107b, the escape interconnect 107c, and the escape interconnect 107d. The third configuration of interconnects may include interconnects arranged in a similar manner as the escape interconnect 107a, the escape interconnect 107b, the escape interconnect 107c, the escape interconnect 107d, the interconnect 230a, the interconnect 230b, the interconnect 230c, the interconnect 230d, the interconnect 250a, the interconnect 250b, the interconnect 250c, and/or the interconnect 250d.

FIG. 3 illustrates an angled top view of a portion of the substrate 102. FIG. 4 illustrates an angled bottom view of a portion of the substrate 102. The substrate 102 includes a dielectric layer 120, a plurality of interconnects 302a, a plurality of interconnects 302b, a plurality of interconnects 302c, a plurality of interconnects 302d, and a plurality of interconnect 302e.

The plurality of interconnects 302a may represent and/or include the interconnect 230a, the escape interconnect 107a and the interconnect 250a. The plurality of interconnects 302b may represent and/or include the interconnect 230b, the escape interconnect 107b and the interconnect 250b. The plurality of interconnects 302c may represent and/or include the interconnect 230c, the escape interconnect 107c and the interconnect 250c. The plurality of interconnects 302d may represent and/or include the interconnect 230d, the escape interconnect 107d and the interconnect 250d. The plurality of interconnects 302e may represent and/or include the interconnect 230e, the escape interconnect 107e and the interconnect 250e.

The plurality of interconnects 302a, the plurality of interconnects 302b, the plurality of interconnects 302d, and the plurality of interconnect 302e may be embedded in the dielectric layer 120. The plurality of interconnects 302c may be located over (e.g., above) a surface of the dielectric layer 120 of the substrate 102. The plurality of interconnects 302c may be a plurality of surface interconnects.

At least portions of the plurality of interconnects 302e are located between the plurality of interconnects 302b and the plurality of interconnects 302d. The plurality of interconnects 302c may considered as intermediate interconnects between two embedded interconnects (e.g., two embedded escape interconnects). The plurality of interconnects 302c are located on a different metal layer than the plurality of interconnects 302a, the plurality of interconnects 302b, the plurality of interconnects 302d, and the plurality of interconnect 302e. The width, minimum width, spacing and/or minimum spacing as described for the interconnects and/or escape interconnects in FIG. 2 are also applicable to the plurality of interconnects 302a, the plurality of interconnects 302b, the plurality of interconnects 302c, the plurality of interconnects 302d, and the plurality of interconnect 302e.

In some implementations, escape interconnects include interconnects that extend in a region between a first set of pads for a first integrated device and a region between a second set of pads for a second integrated device. For example, the escape interconnect 107b, the escape interconnect 107c, and the escape interconnect 107d extend (i) in a region between the interconnect 230a and the interconnect 230e (which may be pads that are coupled to an integrated device 103 through solder interconnects) and (ii) a region between the interconnect 250a and the interconnect 250e (which may be pads that are coupled to an integrated device 105 through solder interconnects). It is noted that the interconnect 230c and the interconnect 250c may be both a surface interconnect and an embedded interconnect. That is for example, a portion (e.g., first portion) of the interconnect 230c may be located on the same metal layer as the escape interconnect 107c, and another portion (e.g., second portion) of the interconnect 230c may be located on the same metal layer as the interconnect 230a, the interconnect 230b, and/or the interconnect 230d. Similarly, a portion (e.g., first portion) of the interconnect 250c may be located on the same metal layer as the escape interconnect 107c, and another portion (e.g., second portion) of the interconnect 250c may be located on the same metal layer as the interconnect 250a, the interconnect 250b, and/or the interconnect 250d. An example where a pad interconnect may be both a surface interconnect and an embedded interconnect is illustrated in FIGS. 3 and 4, with respect to interconnects from the plurality of interconnects 302c.

Providing a surface escape interconnect (e.g., surface escape trace interconnect) between two embedded escape interconnects (e.g., two embedded escape trace interconnects) helps provide high density interconnects and improved fabrication yields during the fabrication of the substrate, which can help reduce the overall cost of the substrate and/or the package. The fabrication process of a substrate may produce interconnects that are not located in the exact location. Using the surface escape interconnect between two embedded escape interconnects helps insure and provide a functioning substrate, even if the escape interconnects are not located exactly where they are designed to because the at least portions of the surface escape interconnect are located on a different metal layer than the embedded escape interconnects.

Figure 5:
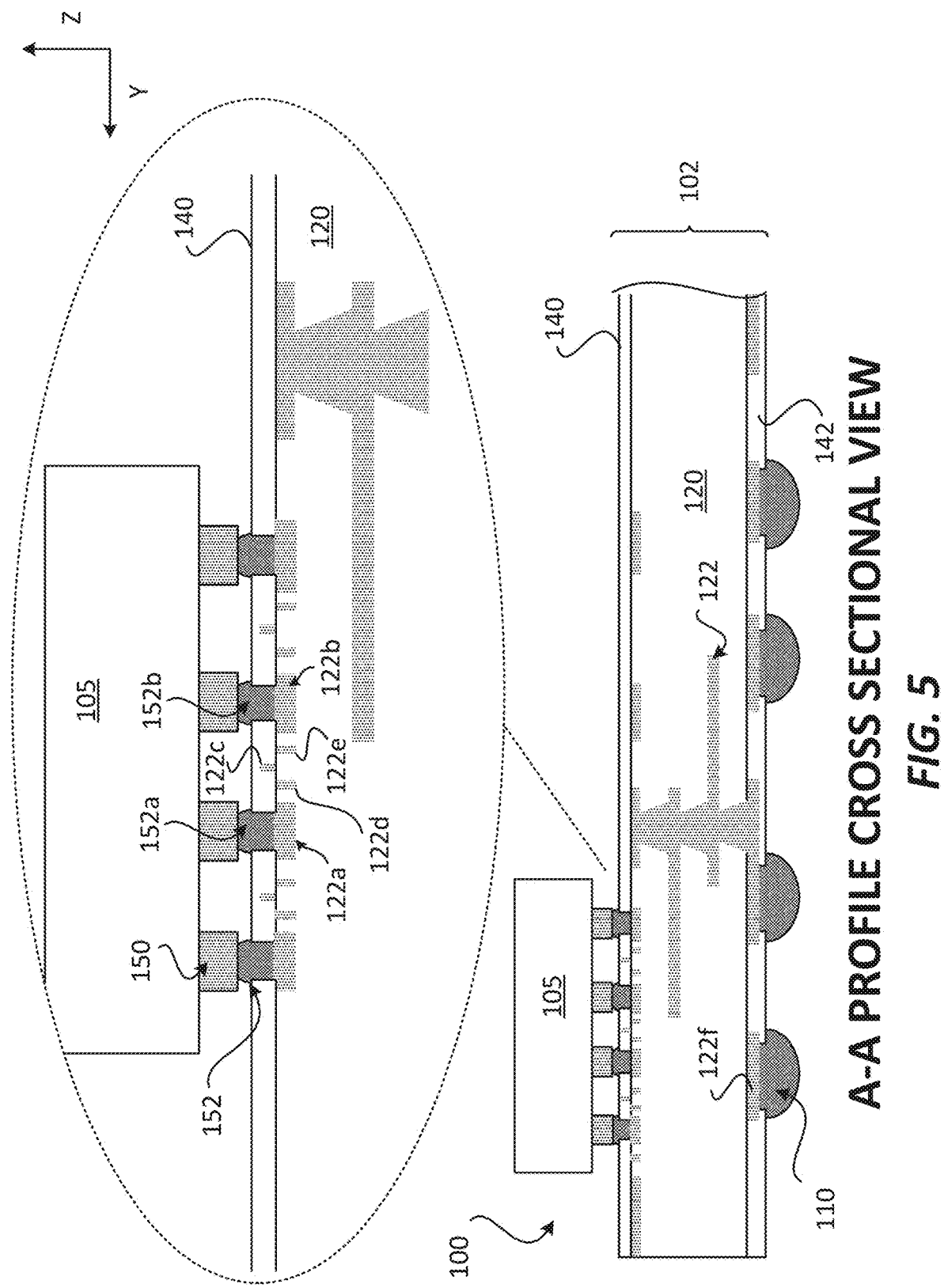
FIG. 5 illustrates a profile/side cross sectional view of a package that includes integrated devices and a substrate with escape interconnects, across an A-A cross section.

FIG. 5 illustrates a profile cross sectional view of a package 100 across an A-A cross section. The package 100 includes the integrated device 105 and the substrate 102. The substrate 102 includes at least one dielectric layer 120, a plurality of interconnects 122, a solder resist layer 140, a solder resist layer 142, a plurality of solder interconnects 110. The integrated device 105 is coupled to a first surface (e.g., top surface) of the substrate 102 through a plurality of pillar interconnects 150 and/or a plurality of solder interconnects 152. For example, the integrated device 105 is coupled to the plurality of interconnects 122 of the substrate 102 through the plurality of pillar interconnects 150 and/or the plurality of solder interconnects 152. The plurality of solder interconnects 152 includes a solder interconnect 152 and a solder interconnect 152b. It is noted that the package 100 also includes the integrated device 103 (not shown). As shown and described below in at least FIG. 6, the integrated device 103 is coupled to the substrate 102 through a plurality of pillar interconnects 130 and/or a plurality of solder interconnects 132. For example, the integrated device 103 is coupled to the plurality of interconnects 122 of the substrate 102 through the plurality of pillar interconnects 130 and/or the plurality of solder interconnects 132.

The plurality of interconnects 122 includes an interconnect 122a, an interconnect 122b, an interconnect 122c, an interconnects 122d, an interconnect 122e, an interconnect 122f. The interconnect 122a and the interconnect 122b may represent pad interconnects (e.g., neighboring pad interconnects). In some implementations, the interconnect 122a and/or the interconnect 122b may represent the interconnect 250a and/or the interconnect 250e, as described in FIG. 2. In some implementations, the interconnect 122b may represent the escape interconnect 107c (e.g., surface escape interconnect), as described in FIG. 2. In some implementations, the interconnect 122d may represent the escape interconnect 107b (e.g., embedded escape interconnect), as described in FIG. 2. In some implementations, the interconnect 122e may represent the escape interconnect 107d (e.g., embedded escape interconnect), as described in FIG. 2.

The solder interconnect 152a may be coupled to the interconnect 122a. The solder interconnect 152b may be coupled to the interconnect 122b. The interconnect 122c may be covered by the solder resist layer 140. The solder interconnect 152a and the solder interconnect 152b may be located laterally to the interconnect 122c. The interconnect 122c is located on a different metal layer than the interconnect 122a, the interconnect 122b, the interconnect 122d and the interconnect 122e.

The solder resist layer 140 is located on a first side (e.g., top side) and/or a first surface of the substrate 102. The solder resist layer 142 is located on a second side (e.g., bottom side) and/or a second surface of the substrate 102. The plurality of solder interconnects 110 is coupled a second surface (e.g., bottom surface) of the substrate 102. The plurality of solder interconnects 110 is coupled to the plurality of interconnects 122 (e.g., interconnect 122f).

In some implementations, at least a portion of the first surface (e.g., top surface, surface facing away from a center portion of a substrate) of the interconnect 122d (e.g., first embedded escape interconnect) and at least a portion of the first surface (e.g., top surface, surface facing away from a center portion of a substrate) of the interconnect 122e (e.g., second embedded escape interconnect) may be planar with at least a portion of the second surface (e.g., bottom surface, surface facing towards a center portion of a substrate) of the interconnect 122c (e.g., surface escape interconnect, third escape interconnect, third surface escape interconnect). At least a portion of the interconnect 122c may be considered between at least a portion of the interconnect 122d and at least a portion of the interconnect 122e. When the interconnect 122c is considered between the interconnect 122d and the interconnect 122e, it may mean that the interconnect 122c is between two imaginary vertical planes that extend perpendicularly from the surface of the substrate through the interconnect 122d and the interconnect 122e. The imaginary vertical planes may start from the interconnect 122d and/or the interconnect 122e and extend away from the inner and/or the center portion of the substrate.

Figure 6:
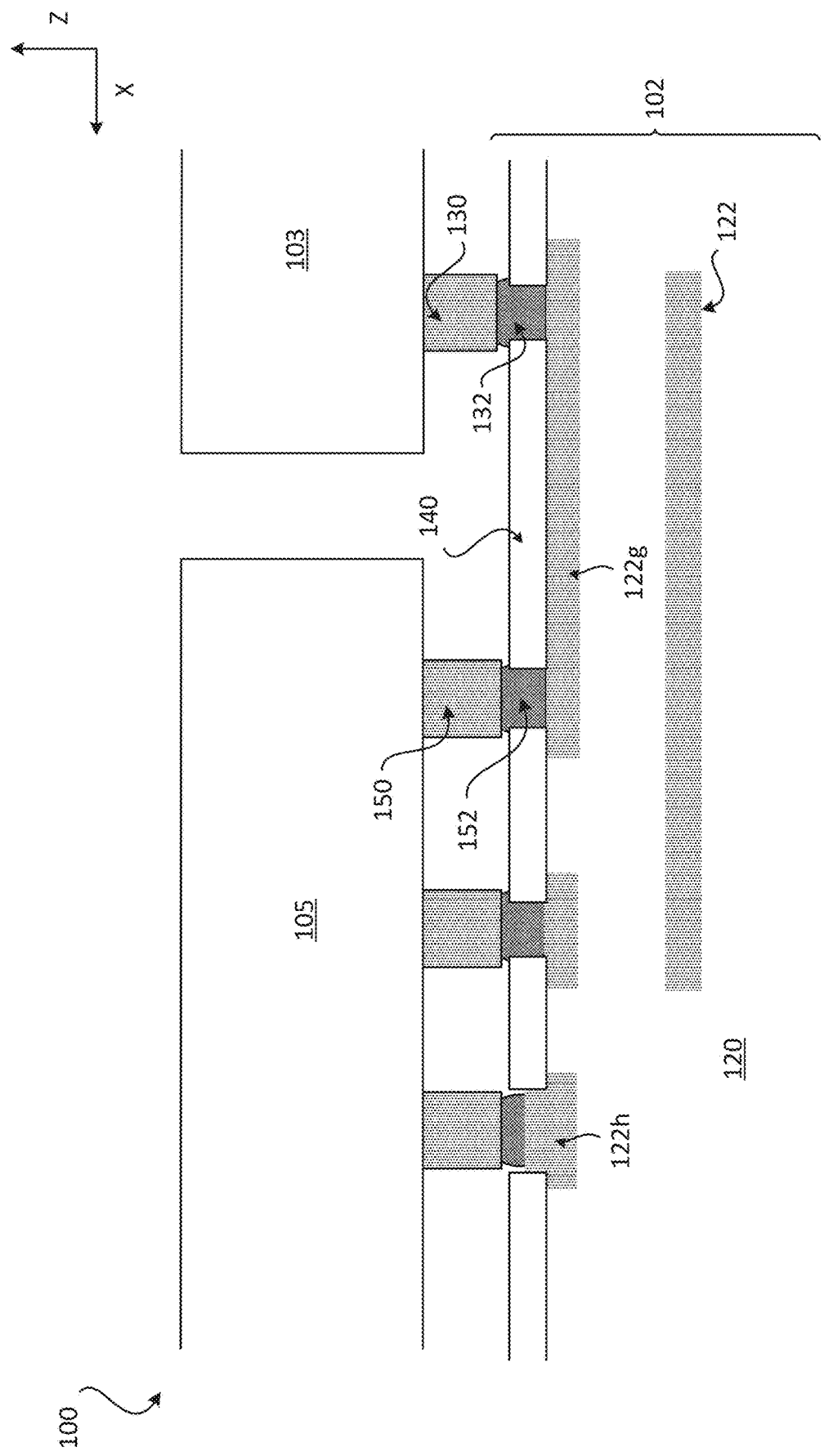
FIG. 6 illustrates a profile/side cross sectional view of a package that includes integrated devices and a substrate with escape interconnects, across a B-B cross section.

FIG. 6 illustrates a profile cross sectional view of a package 100 across a B-B cross section. The package 100 includes the substrate 102, the integrated device 103 and the integrated device 105. The substrate 102 includes at least one dielectric layer 120 and a plurality of interconnects 122. The plurality of interconnects 122 includes an interconnect 122g and an interconnect 122h. The interconnect 122g may represent an embedded escape interconnect. The interconnect 122h may be embedded in the at least one dielectric layer 120 and may be protruding from the at least one dielectric layer 120. That is, part of the interconnect 122h is located in the at least one dielectric layer 120 and part of the interconnect 122h is external to the dielectric layer 120. Part of the interconnect 122h may be located laterally to the solder resist layer 140. Portions of the interconnect 122h may be on the same metal layer as the interconnect 122g. The interconnect 122h may be similar to the interconnect 250c. The integrated device 103 is coupled to a first surface (e.g., top surface) of the substrate 102 through a plurality of pillar interconnects 130 and/or a plurality of solder interconnects 132. The integrated device 105 is coupled to a first surface (e.g., top surface) of the substrate 102 through a plurality of pillar interconnects 150 and/or a plurality of solder interconnects 152. The integrated device 103 is configured to be electrically coupled to the integrated device 105 through the interconnect 122g of the substrate 102. An electrical path for an input/output (I/O) signal and/or current between the integrated device 103 and the integrated device 105 may include a pillar interconnect from the plurality of pillar interconnects 130, a solder interconnect from the plurality of solder interconnect 132, the interconnect 122g, a solder interconnect from the plurality of solder interconnects 152 and a pillar interconnect from the plurality of pillar interconnects 150.

Figure 7:
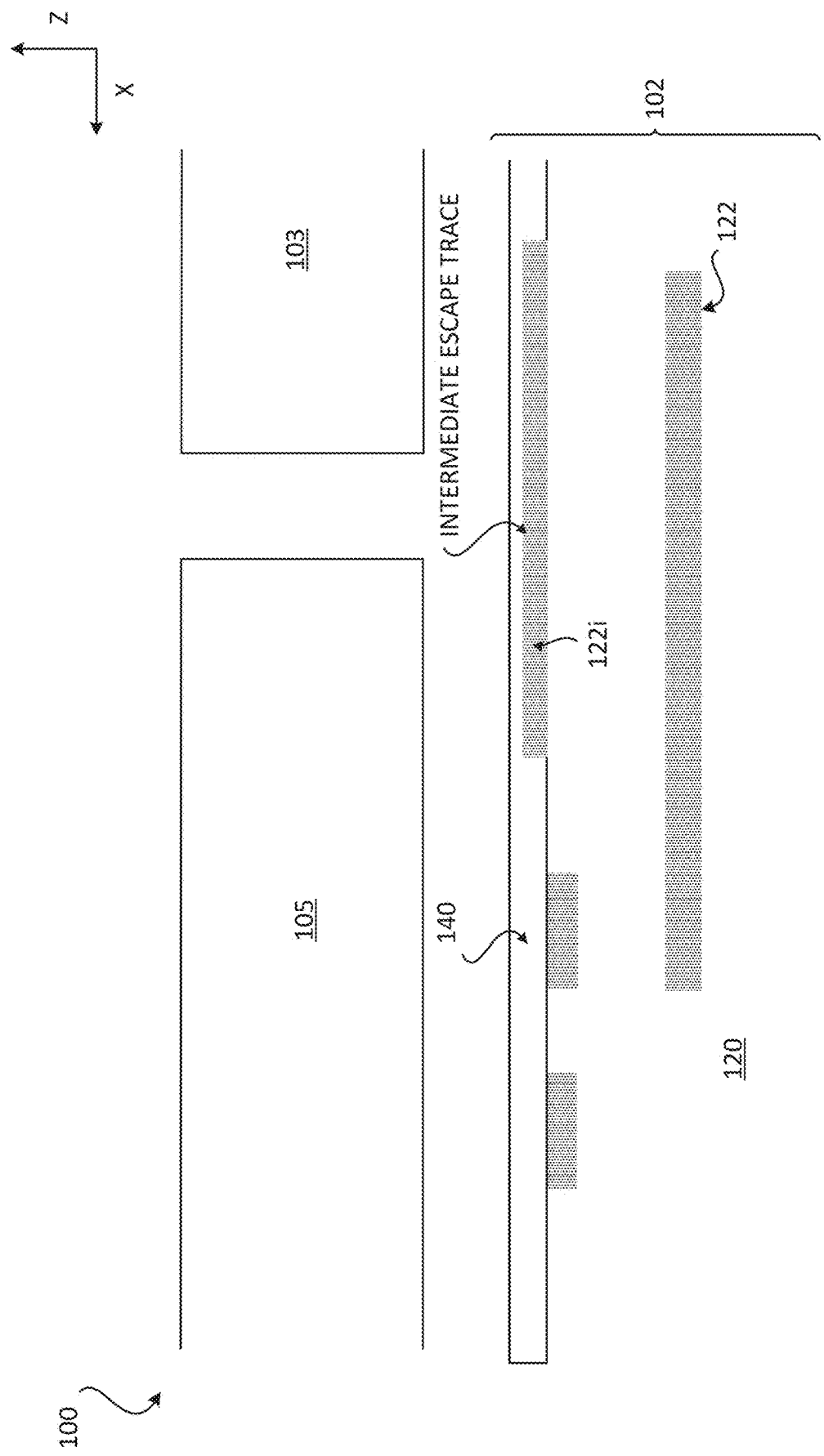
FIG. 7 illustrates a profile/side cross sectional view of a package that includes integrated devices and a substrate with escape interconnects, across a C-C cross section.

FIG. 7 illustrates a profile cross sectional view of a package 100 across a C-C cross section. The package 100 includes the substrate 102, the integrated device 103 and the integrated device 105. The substrate 102 includes at least one dielectric layer 120 and a plurality of interconnects 122. The plurality of interconnects 122 includes an interconnect 122i. The interconnect 122i may represent a surface escape interconnect (e.g., 107c). The interconnect 122i may represent an intermediate escape interconnect.

Figure 8:
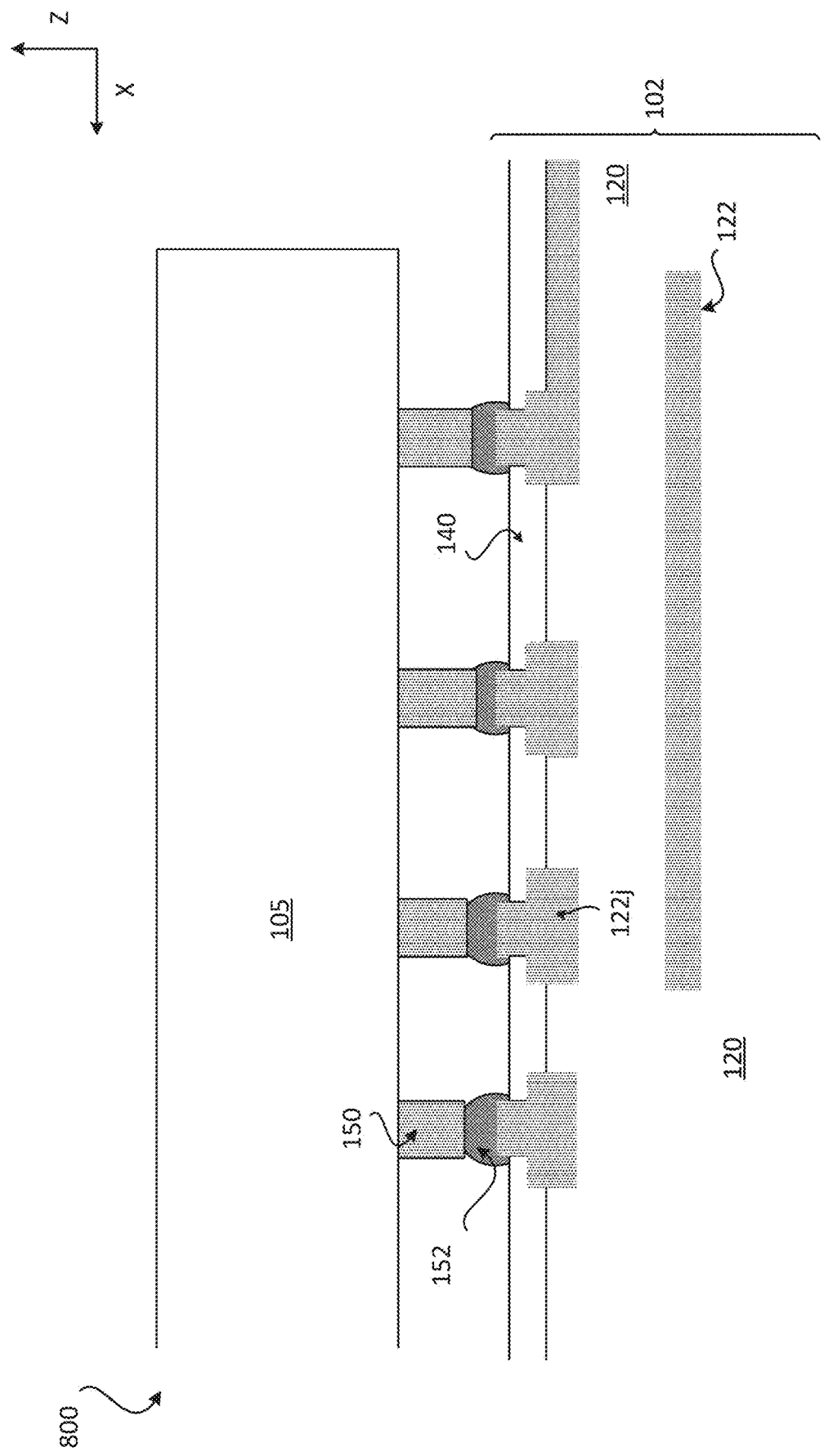
FIG. 8 illustrates a profile/side cross sectional view of a package that includes integrated devices and a substrate with escape interconnects, across a B-B cross section.

FIG. 8 illustrates a profile cross sectional view of a package 800 across a B-B cross section. The package 800 is similar to the package 100, and includes similar components as the package 100. As shown in FIG. 8, the substrate of the package 800 includes post interconnects (e.g., posts). The package 800 includes the substrate 102, the integrated device 103 and the integrated device 105. The substrate 102 includes at least one dielectric layer 120 and a plurality of interconnects 122. The plurality of interconnects 122 includes an interconnect 122j. The interconnect 122j may represent a surface interconnect (e.g., 250c). The interconnect 122j may include a pad (e.g., pad interconnect) and post (e.g., post interconnect). A solder interconnect from the plurality of solder interconnects 152 is coupled to the interconnect 122j (e.g., solder interconnect is coupled to post of the interconnect 122j).

An integrated device (e.g., 103, 105) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 103, 105) may include at least one electronic circuit (e.g., first electronic circuit, second electronic circuit, etc. . . . ). An integrated device may include transistors. An integrated device may be an example of an electrical component and/or electrical device. In some implementations, an integrated device may include a chiplet. A chiplet may be fabricated using a process that provides better yields compared to other processes that are used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Using several chiplets that perform several functions may reduce the overall cost of a package relative to using a single chip to perform all of the functions of a package.

A substrate may have a different number of metal layers. Different implementations may use different substrates. The substrate may include an embedded trace substrate (ETS). The at least one dielectric layer 120 may include prepreg. An example of fabricating a substrate is further described below in FIGS. 9A-9D.

The package (e.g., 100, 800) may be implemented in a radio frequency (RF) package. The RF package may be a radio frequency front end (RFFE) package. A package (e.g., 100) may be configured to provide Wireless Fidelity (WiFi) communication and/or cellular communication (e.g., 2G, 3G, 4G, 5G). The packages (e.g., 100. 800) may be configured to support Global System for Mobile (GSM) Communications. Universal Mobile Telecommunications System (UMTS), and/or Long-Term Evolution (LTE). The packages (e.g., 100) may be configured to transmit and receive signals having different frequencies and/or communication protocols.

Having described various substrates with escape interconnects, sequences and methods for fabricating substrates with escape interconnects will now be described below.

Exemplary Sequence for Fabricating a Substrate Comprising Escape Interconnects

FIGS. 9A-9D illustrate an exemplary sequence for providing or fabricating a substrate. In some implementations, the sequence of FIGS. 9A-9D may be used to provide or fabricate the substrate 102 described in the disclosure.

It should be noted that the sequence of FIGS. 9A-9D may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure. Different implementations may fabricate a substrate differently.

Figure 9A:
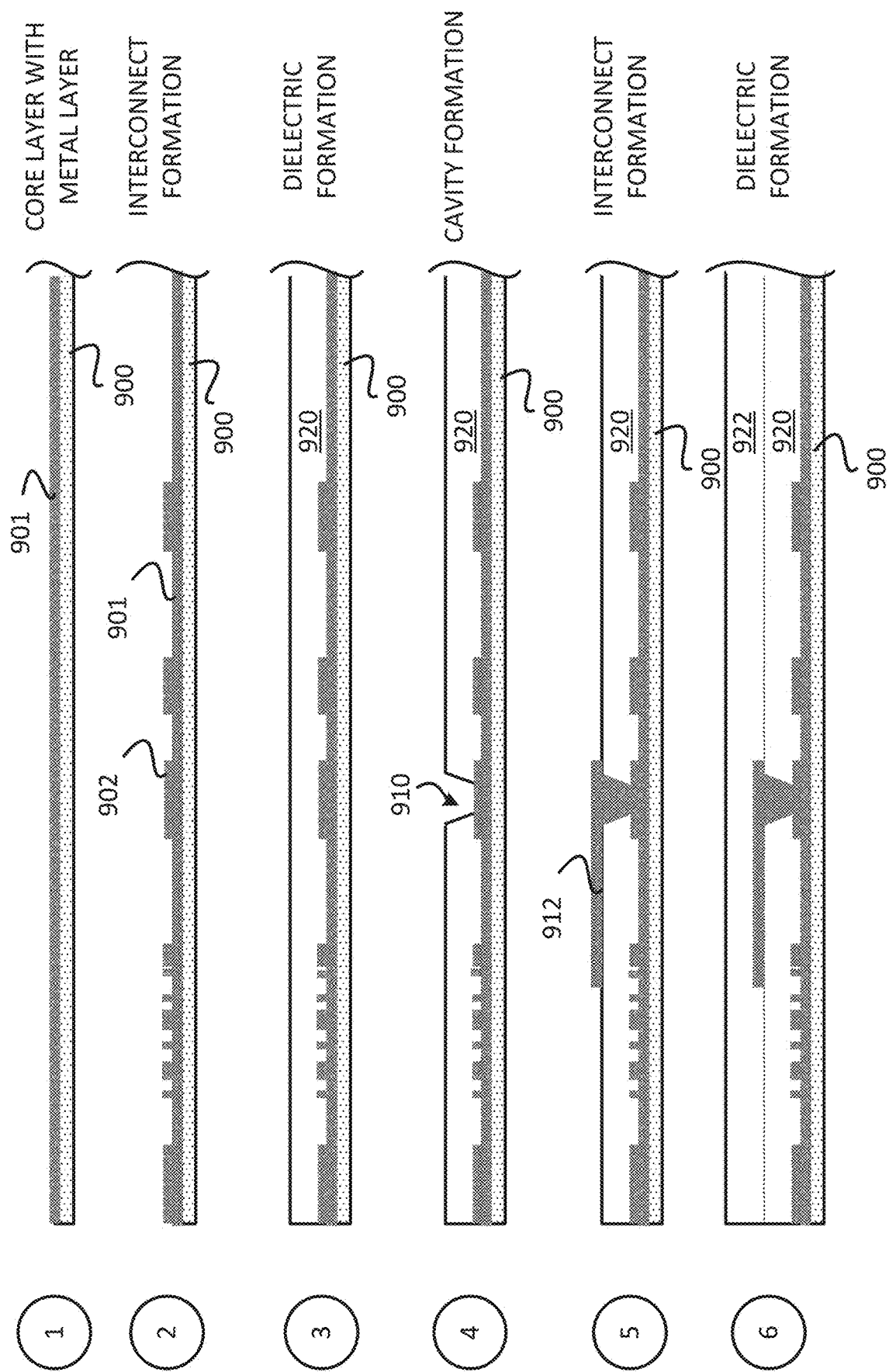

Stage 1, as shown in FIG. 9A, illustrates a state after a core layer 900 is provided. The core layer 900 includes a metal layer 901. The metal layer 901 may include a seed layer (e.g., copper seed layer). Another metal layer may be located on the other side of the core layer. It is noted that the following process will be described through a fabrication process that forms interconnects and dielectric layers on one side of the core layer. However, in some implementations, the interconnects and dielectric layers may be formed on both sides of the core layer 900. The core layer 900 is an example of a carrier that is used as a base. In some implementations, other carriers may be used, such as glass or quartz.

Stage 2 illustrates a state after interconnects 902 are formed over the core layer 900 and the metal layer 901. The interconnects 902 may be patterned from a metal layer. A plating process and etching process may be used to form the metal layer and interconnects. At least some of the interconnects 902 may include escape interconnects (e.g., embedded escape interconnects).

Stage 3 illustrates a state after a dielectric layer 920 is formed over the core layer 900 and the interconnects 902. The dielectric layer 920 may include polyimide. A deposition and/or lamination process may be used to form the dielectric layer 920. However, different implementations may use different materials for the dielectric layer.

Stage 4 illustrates a state after a plurality of cavities 910 is formed in the dielectric layer 920. The plurality of cavities 910 may be formed using an etching process (e.g., photo etching process) or laser process.

Stage 5 illustrates a state after interconnects 912 are formed in and over the dielectric layer 920. For example, a via, pad and/or traces may be formed. A plating process may be used to form the interconnects.

Stage 6 illustrates a state after another dielectric layer 922 is formed over the dielectric layer 920. The dielectric layer 922 may be the same material as the dielectric layer 920. However, different implementations may use different materials for the dielectric layer. A deposition and/or lamination process may be used to form the dielectric layer 922.

Figure 9B:
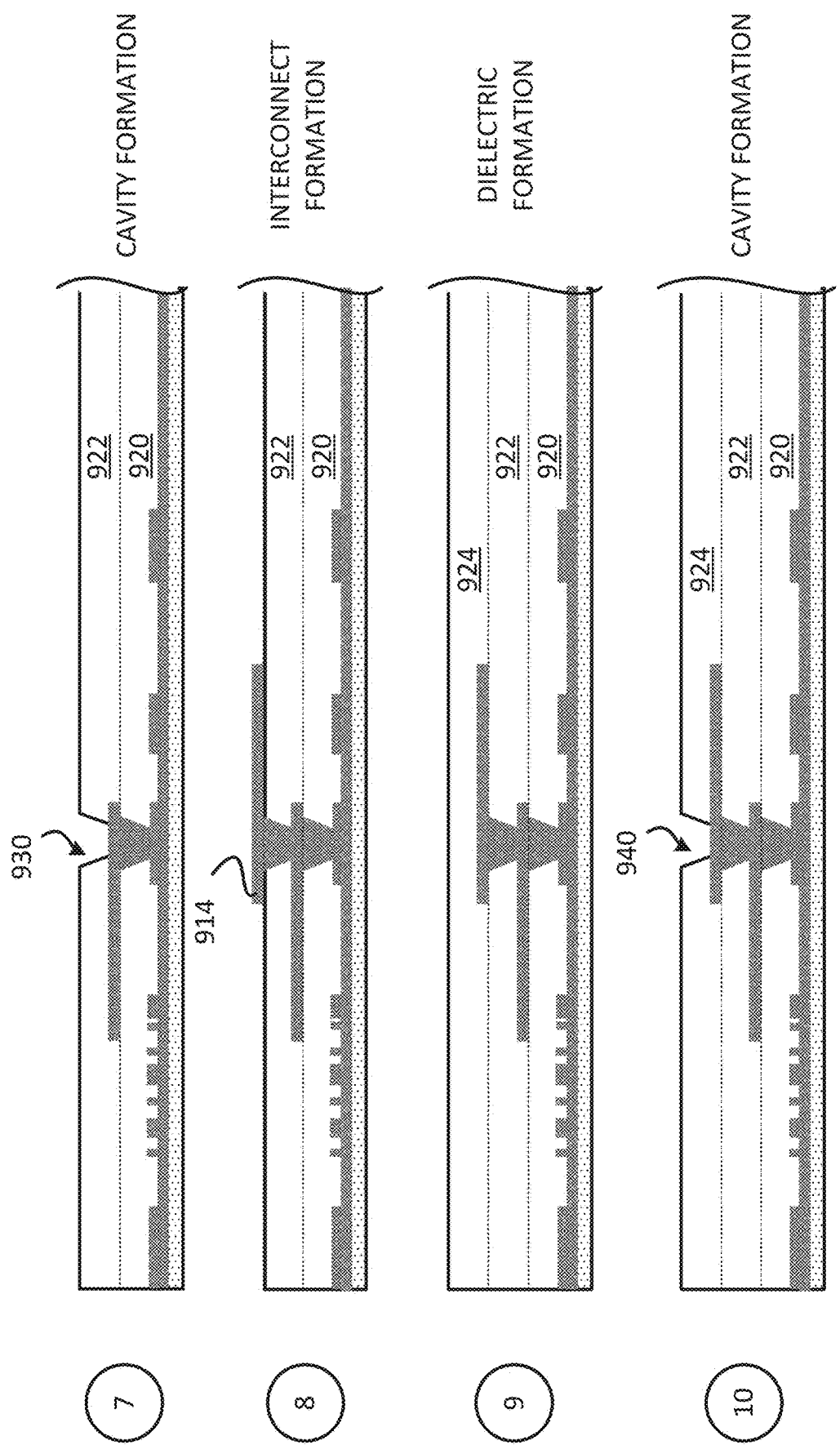

Stage 7, as shown in FIG. 9B, illustrates a state after a plurality of cavities 930 is formed in the dielectric layer 922. An etching process or laser process may be used to form the cavities 930.

Stage 8 illustrates a state after interconnects 914 are formed in and over the dielectric layer 922. For example, via, pad and/or trace may be formed. A plating process may be used to form the interconnects.

Stage 9 illustrates a state after another dielectric layer 924 is formed over the dielectric layer 922. The dielectric layer 924 may be the same material as the dielectric layer 920. However, different implementations may use different materials for the dielectric layer. A deposition and/or lamination process may be used to form the dielectric layer 924.

Stage 10 illustrates a state after a plurality of cavities 940 is formed in the dielectric layer 924. An etching process or laser process may be used to form the cavities 1440.

Stage 11, as shown in FIG. 9C, illustrates a state after interconnects 916 are formed in and over the dielectric layer 924. For example, via, pad and/or trace may be formed. A plating process may be used to form the interconnects.

Some or all of the interconnects 902, 912, 914 and/or 916 may define the plurality of interconnects 122 of the substrate 102. The dielectric layers 920, 922, 924 may be represented by the at least one dielectric layer 120.

Stage 12 illustrates a state after the core layer 900 is decoupled (e.g., removed, grinded out) from the metal layer 901 and the dielectric layer 120, leaving the substrate 102 with the plurality of interconnects 122 and the metal layer 901.

Stage 13 illustrates a state after a mask 970 is formed over the metal layer 901. A deposition process may be used to form the mask 970.

Figure 9D:
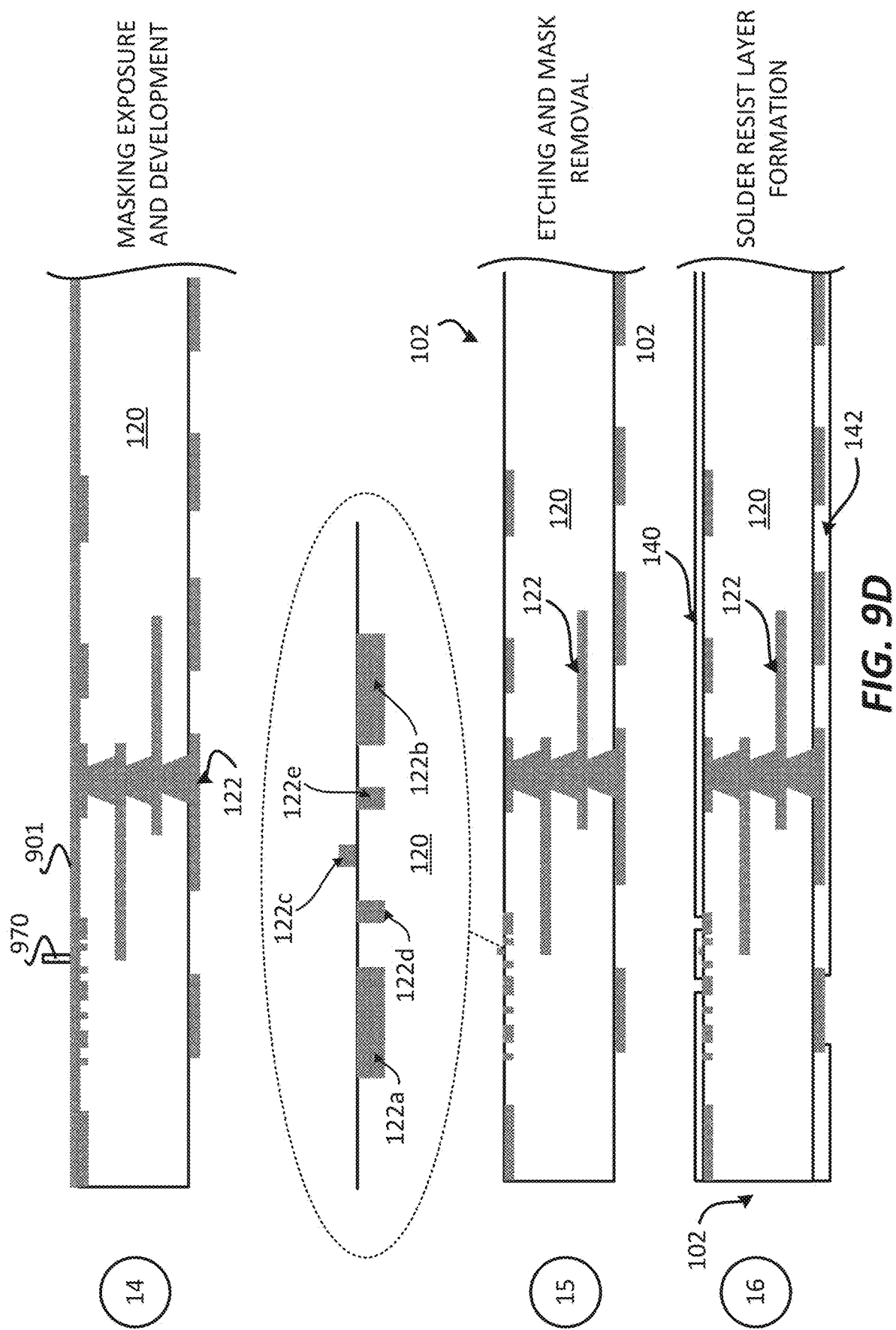

Stage 14, as shown in FIG. 9D, illustrates after the mask 970 is exposed and developed to form a mask pattern.

Stage 15 illustrates a state after the metal layer 901 is etched (e.g., photoetched) to form interconnects, and the mask 970 has been removed. For example, the metal layer 901 may be etched to form the interconnect 122c, which may be a surface escape interconnect.

Stage 16 illustrates a state after a solder resist layer 140 is formed over a first surface of the at least one dielectric layer 120, and a solder resist layer 142 is formed over a second surface of the at least one dielectric layer 120. Stage 16 may illustrate a substrate 102 that includes the interconnect 122a, the interconnect 122b, the interconnect 122c, the interconnect 122d and interconnect 122e. Some of the interconnects from the plurality of interconnects 122 may be embedded escape interconnects and surface escape interconnects.

Figure 10:
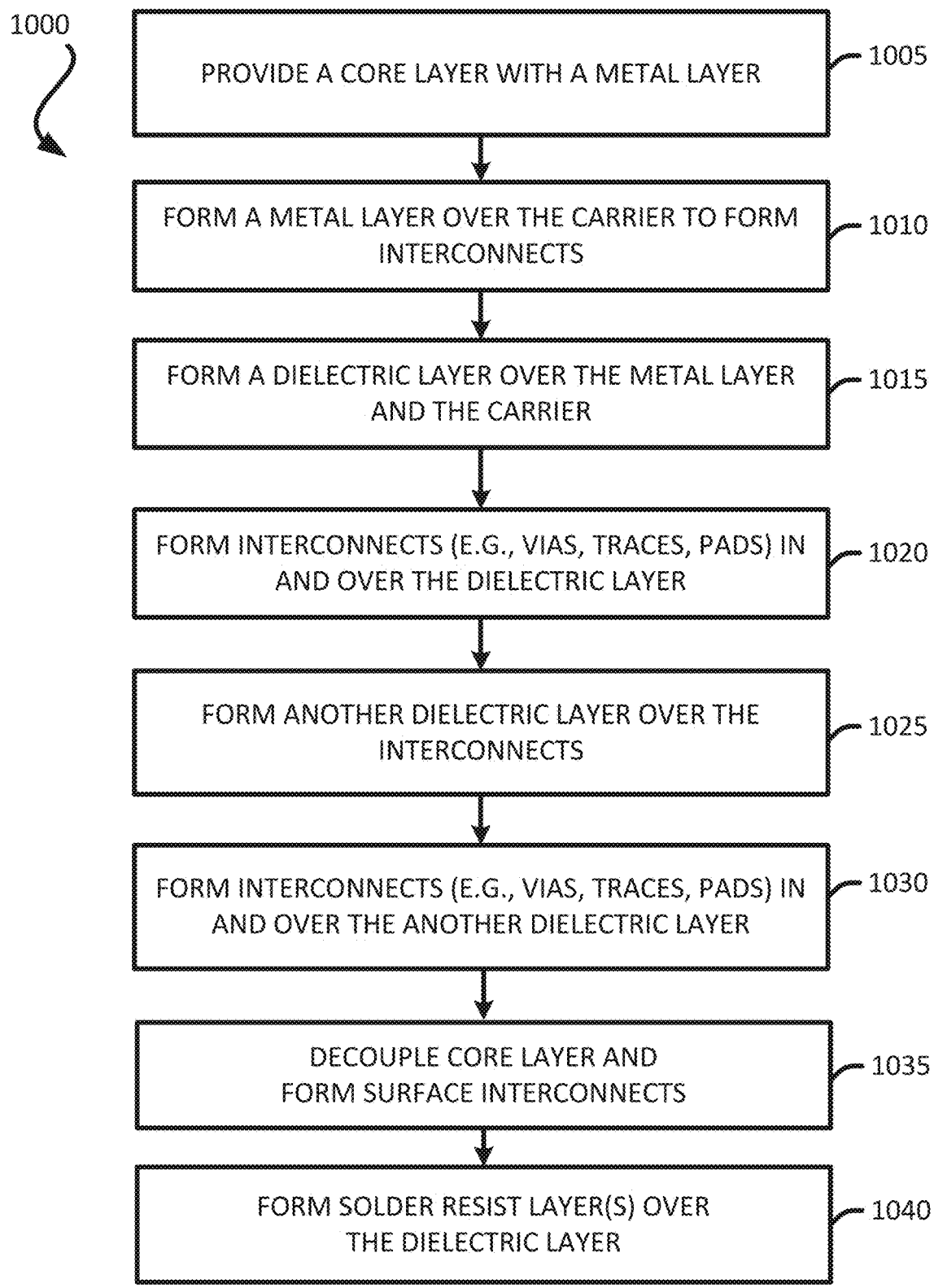
FIG. 10 illustrates an exemplary flow diagram of a method for fabricating a substrate with escape interconnects.

Exemplary Flow Diagram of a Method for Fabricating a Substrate Comprising Escape Interconnects In some implementations, fabricating a substrate includes several processes. FIG. 10 illustrates an exemplary flow diagram of a method 1000 for providing or fabricating a substrate. In some implementations, the method 1000 of FIG. 10 may be used to provide or fabricate the substrate 102.

It should be noted that the method of FIG. 10 may combine one or more processes in order to simplify and/or clarify the method for providing or fabricating a substrate. In some implementations, the order of the processes may be changed or modified.

The method provides (at 1005) a core layer 900 that includes a metal layer 901. Different implementations may use different materials for the core layer. It is noted that the core layer is an example of a carrier that may be used.

However, other carriers may be used. For example, the carrier may include a substrate, glass, quartz and/or carrier tape. Stage 1 of FIG. 9A illustrates and describes an example of a state after a core layer with a metal layer is provided.

The method forms (at 1010) a metal layer over the core layer 900 and the metal layer 901. The metal layer may be patterned to form interconnects 902. A plating process may be used to form the metal layer and interconnects. The interconnects 902 may include escape interconnects (e.g., embedded escape interconnects). Stage 2 of FIG. 9A illustrates and describes an example of a state after a metal layer and interconnects 902 are formed.

The method forms (at 1015) a dielectric layer 920 over the core layer 900, the metal layer 901 and the interconnects 902. The dielectric layer 920 may include polyimide. Forming the dielectric layer may also include forming a plurality of cavities (e.g., 910) in the dielectric layer 920. The plurality of cavities may be formed using an etching process (e.g., photo etching) or laser process. Stages 3-4 of FIG. 9A illustrate and describe an example of forming a dielectric layer and cavities in the dielectric layer.

The method forms (at 1020) interconnects in and over the dielectric layer. For example, the interconnects 912 may be formed in and over the dielectric layer 920. A plating process may be used to form the interconnects. Forming interconnects may include providing a patterned metal layer over and/or in the dielectric layer. Stage 5 of FIG. 9A illustrates and describes an example of forming interconnects in and over a dielectric layer.

The method forms (at 1025) a dielectric layer 922 over the dielectric layer 920 and the interconnects. The dielectric layer 922 may include polyimide. Forming the dielectric layer may also include forming a plurality of cavities (e.g., 930) in the dielectric layer 922. The plurality of cavities may be formed using an etching process or laser process. Stages 6-7 of FIGS. 9A-9B illustrate forming a dielectric layer and cavities in the dielectric layer.

The method forms (at 1030) interconnects in and/or over the dielectric layer. For example, the interconnects 914 may be formed. A plating process may be used to form the interconnects. Forming interconnects may include providing a patterned metal layer over an in the dielectric layer. Stage 8 of FIG. 9B illustrates and describes an example of forming interconnects in and over a dielectric layer.

The method may form additional dielectric layer(s) and additional interconnects as described at 1025 and 1030. Stages 9-11 of FIGS. 9B-9C illustrate and describe an example of forming additional interconnects in and over a dielectric layer.

Once all the dielectric layer(s) and additional interconnects are formed, the method may decouple (e.g., remove, grind out) (at 1035) the core layer (e.g., 900) from the dielectric layer 920, leaving a substrate. Stage 12 of FIG. 9C illustrates and describes an example of a substrate after the decoupling a core layer.

The method may also form (at 1035) interconnects by forming interconnects over the surface of the at least one dielectric layer 120. A masking, an exposure, a development, an etching, and mask removal process may be used to form the surface interconnects. The surface interconnects may include surface escape interconnects. The surface interconnects may be formed from a metal layer 901. Stages 13-15 of FIGS. 9C-9D illustrates and describes an example of forming surface interconnects.

The method may form (at 1040) solder resist layers (e.g., 140, 142) over the substrate. A lamination, coating, and/or exposure process may be used to form the solder resist layer. Stage 16 of FIG. 9D illustrates and describes an example of a state after forming solder resist layers.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Figure 11:
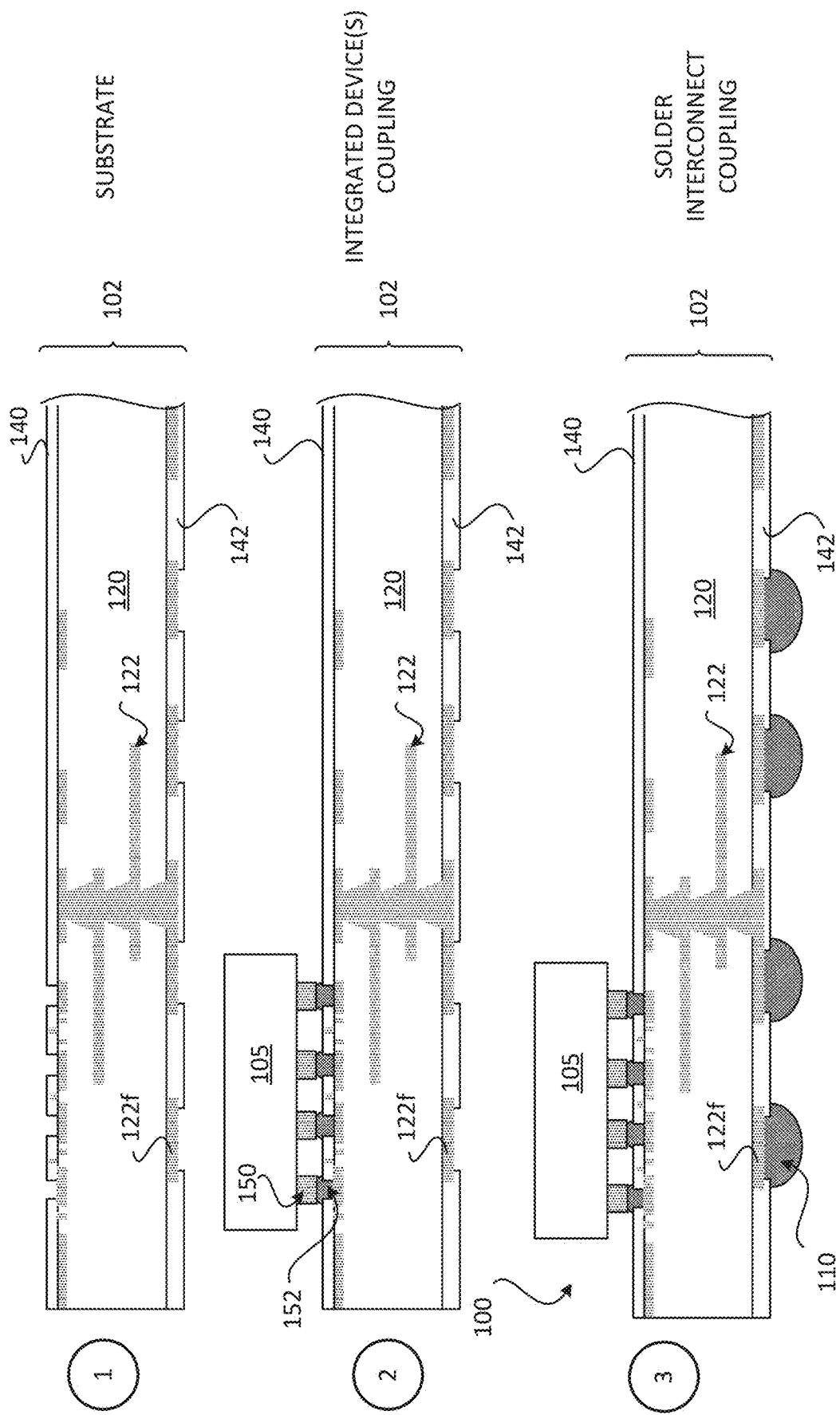
FIG. 11 illustrates an exemplary sequence for fabricating a package that includes a substrate with escape interconnects.

Exemplary Sequence for Fabricating a Package that Includes a Substrate Comprising Escape Interconnects FIG. 11 illustrates an exemplary sequence for providing or fabricating a package that includes a substrate comprising escape interconnects. In some implementations, the sequence of FIG. 11 may be used to provide or fabricate the package 100 that includes a substrate comprising escape interconnects described in the disclosure.

It should be noted that the sequence of FIG. 11 may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIG. 11 may be used to fabricate one package or several packages at a time (as part of a wafer).

Stage 1, as shown in FIG. 11, illustrates a state after the substrate 102 is provided. The substrate 102 may be provided by a supplier or fabricated. A process similar to the process shown in FIGS. 9A-9D may be used to fabricate the substrate 102. However, different implementations may use different processes to fabricate the substrate 102. The substrate 102 includes at least one dielectric layer 120, and a plurality of interconnects 122. The plurality of interconnects 122 may include embedded escape interconnects and surface escape interconnects, as described in at least FIGS. 2-8. The plurality of escape interconnects may include a first embedded escape interconnect, a second embedded escape interconnect, and a third escape interconnect located between the first embedded escape interconnect and the second embedded escape interconnect. The substrate 102 may include an embedded trace substrate (ETS). In some implementations, the at least one dielectric layer 120 may include prepreg layers.

Stage 2 illustrates a state after the integrated device 105 is coupled to a first surface (e.g., top surface) of the substrate 102. The integrated device 105 may be coupled to the substrate 102 through a plurality of pillar interconnects 150 and a plurality of solder interconnects 152. The plurality of pillar interconnects 150 and the plurality of solder interconnects 152 are coupled to the plurality of interconnects 122. A solder reflow process may be used to couple the integrated device 105 to the plurality of escape interconnects through the plurality of pillar interconnects 150 and the plurality of solder interconnects 152. Some implementations may couple more than one integrated device to the substrate 102. For example, the integrated device 103 may be coupled to the first surface of the substrate 102 through a plurality of pillar interconnects 130 and a plurality of solder interconnects 132. The integrated device 103 may be configured to be electrically coupled to the integrated device 105 through embedded escape interconnects and surface escape interconnects of the substrate 102, as described above in at least FIGS. 2-8.

Stage 3 illustrates a state after a plurality of solder interconnects 110 is coupled to the substrate 102. The plurality of solder interconnects 110 may be couple to interconnects that are located over a second surface of the at least one dielectric layer 120. A solder reflow process may be used to couple the plurality of solder interconnects 110 to the substrate 102. Stage 3 may illustrate the package 100. The packages (e.g., 100) described in the disclosure may be fabricated one at a time or may be fabricated together as part of one or more wafers and then singulated into individual packages.

Figure 12:
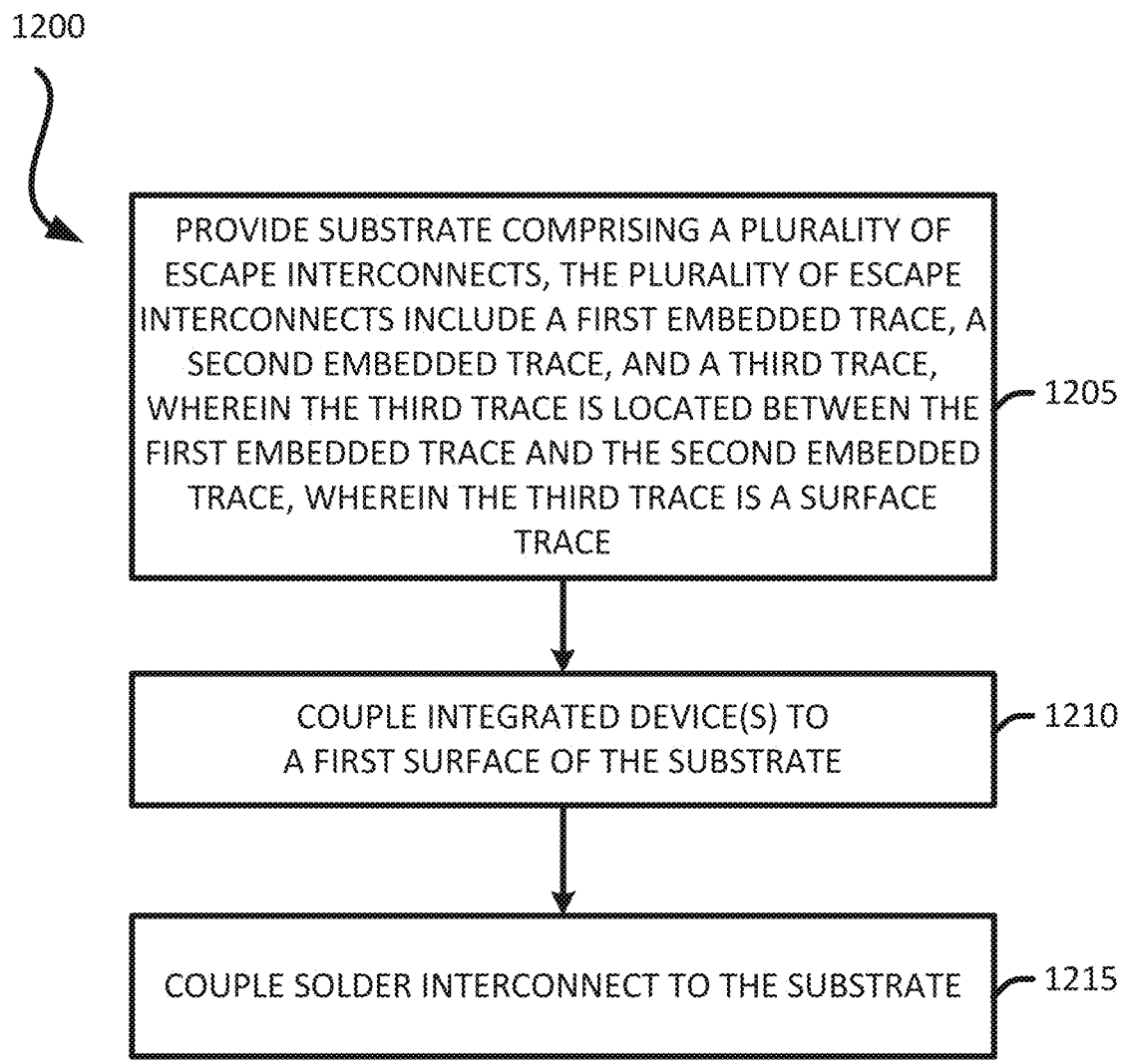
FIG. 12 illustrates an exemplary flow diagram of a method for fabricating a package that includes a substrate with escape interconnects.

Exemplary Flow Diagram of a Method for Fabricating a Package that Includes a Substrate Comprising Escape Interconnects In some implementations, fabricating a package that includes a substrate comprising escape interconnects includes several processes. FIG. 12 illustrates an exemplary flow diagram of a method 1200 for providing or fabricating a package that includes a substrate comprising escape interconnects. In some implementations, the method 1200 of FIG. 12 may be used to provide or fabricate the package 100 of FIG. 1 described in the disclosure. However, the method 1200 may be used to provide or fabricate any of the packages (e.g., 800) described in the disclosure.

It should be noted that the method of FIG. 12 may combine one or more processes in order to simplify and/or clarify the method for providing or fabricating a package that includes a substrate comprising escape interconnects. In some implementations, the order of the processes may be changed or modified.

The method provides (at 1205) a substrate (e.g., 102) with escape interconnects. The substrate 102 may be provided by a supplier or fabricated. The substrate 102 includes at least one dielectric layer 120, and a plurality of interconnects 122. The plurality of interconnects 122 may include escape interconnects. For example, the plurality of escape interconnects may include a first embedded trace, a second embedded trace, and a third trace. The third trace is located between the first embedded trace and the second embedded trace. The third trace is a surface trace. The plurality of escape interconnects may include a first embedded escape interconnect, a second embedded escape interconnect, and a third escape interconnect located between the first embedded escape interconnect and the second embedded escape interconnect. The substrate 102 may include an embedded trace substrate (ETS). In some implementations, the at least one dielectric layer 120 may include prepreg layers. Different implementations may provide different substrates. A process similar to the processes shown in FIGS. 9A-9D may be used to fabricate the substrate 102. However, different implementations may use different processes to fabricate the substrate 102. Stage 1 of FIG. 11 illustrates and describes an example of providing a substrate with escape interconnects.

The method couples (at 1210) at least one integrated device (e.g., 103) to the first surface of the substrate (e.g., 102). For example, the integrated device 103 may be coupled to the substrate 102 through the plurality of pillar interconnects 130 and the plurality of solder interconnects 132. The plurality of pillar interconnects 130 and the plurality of solder interconnects 132 are coupled to the plurality of interconnects (e.g., 122a). A solder reflow process may be used to couple the integrated device 103 to the plurality of interconnects through the plurality of pillar interconnects 130 and the plurality of solder interconnects 132. Stage 2 of FIG. 11 illustrates and describes an example of an integrated device coupled to a substrate.

The method couples (at 1215) a plurality of solder interconnects (e.g., 150) to the second surface of the substrate (e.g., 102). A solder reflow process may be used to couple the plurality of solder interconnects to the substrate. Stage 3 of FIG. 11 illustrates and describes an example of coupling solder interconnects to the substrate.

Exemplary Electronic Devices

Figure 13:
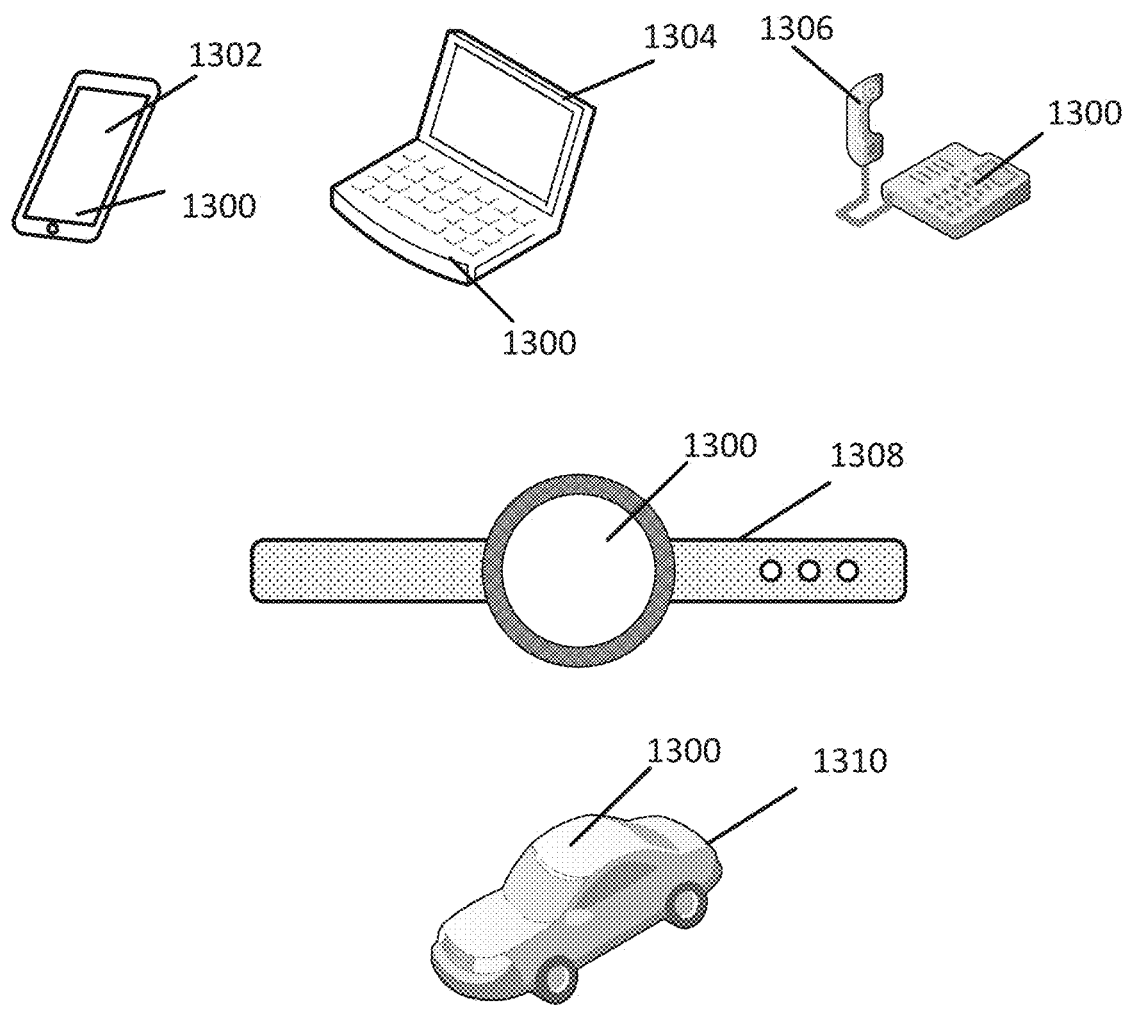
FIG. 13 illustrates various electronic devices that may integrate a die, an electronic circuit, an integrated device, an integrated passive device (IPD), a passive component, a package, and/or a device package described herein.

FIG. 13 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1302, a laptop computer device 1304, a fixed location terminal device 1306, a wearable device 1308, or automotive vehicle 1310 may include a device 1300 as described herein. The device 1300 may be, for example, any of the devices and/or integrated circuit (IC) packages described herein. The devices 1302, 1304, 1306 and 1308 and the vehicle 1310 illustrated in FIG. 13 are merely exemplary. Other electronic devices may also feature the device 1300 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-8, 9A-9D and/or 10-13 may be rearranged and/or combined into a single component, process, feature or function or embodied in several components, processes, or functions. Additional elements, components, processes, and/or functions may also be added without departing from the disclosure. It should also be noted FIGS. 1-8, 9A-9D and/or 10-13 and its corresponding description in the present disclosure is not limited to dies and/or ICs. In some implementations, FIGS. 1-8, 9A-9D and/or 10-13 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (POP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising a substrate, a first integrated device coupled to the substrate; and a second integrated device coupled to the substrate. The substrate comprising at least one dielectric layer; and a plurality of interconnects comprising a plurality of escape interconnects. The plurality of escape interconnects comprises a first embedded escape interconnect; a second embedded escape interconnect; and a third escape interconnect located between the first embedded escape interconnect and the second embedded escape interconnect.

Aspect 2: The package of aspect 1, wherein the third escape interconnect comprises a surface escape interconnect.

Aspect 3: The package of aspects 1 through 2, wherein the second integrated device is configured to be electrically coupled to the first integrated device through the plurality of escape interconnects.

Aspect 4: The package of aspects 1 through 3, wherein the first embedded escape interconnect comprises a first embedded escape pad and a first embedded trace, wherein the second embedded escape interconnect comprises a second embedded escape pad and a second embedded escape trace, and wherein the third escape interconnect comprises a first surface escape pad and a first surface escape trace.

Aspect 5: The package of aspect 4, wherein the second integrated device is configured to be electrically coupled to the first integrated device through the first embedded escape pad, the first embedded escape trace, the second embedded escape pad, the second embedded escape trace, the first surface escape pad and the first surface escape trace.

Aspect 6: The package of aspect 5, wherein a first electrical path between the first integrated device and the second integrated device includes the first embedded escape pad and the first embedded escape trace, wherein a second electrical path between the first integrated device and the second integrated device includes the second embedded escape pad and the second embedded escape trace, and wherein a third electrical path between the first integrated device and the second integrated device includes the first surface escape pad and the first surface escape trace.

Aspect 7: The package of aspects 1 through 6, wherein a minimum width of the first embedded escape interconnect, the second embedded escape interconnect and the third escape interconnect is in a range of about 10-15 micrometers. In some implementations, the minimum width is the width the first embedded escape interconnect, the second embedded escape interconnect and the third escape interconnect.

Aspect 8: The package of aspects 1 through 7, wherein a first minimum spacing between the first embedded escape interconnect and the third escape interconnect is in a first range of about 10-15 micrometers, and wherein a second minimum spacing between the second embedded escape interconnect and the third escape interconnect is in a second range of about 10-15 micrometers. In some implementations, the first minimum spacing is a first spacing between the first embedded escape interconnect and the third escape interconnect. In some implementations, the second minimum spacing is a second spacing between the second embedded escape interconnect and the third escape interconnect.

Aspect 9: The package of aspects 1 through 8, wherein the first integrated device includes a first chiplet and the second integrated device includes a second chiplet.

Aspect 10: The package of aspects 1 through 9, wherein a portion of the third escape interconnect is located parallel to a portion of the first embedded escape interconnect and a portion of the second embedded escape interconnect, and wherein the third escape interconnect is located on a different metal layer than the first embedded escape interconnect and the second embedded escape interconnect.

Aspect 11: A package comprising a substrate; a first integrated device coupled to the substrate; and a second integrated device coupled to the substrate. The substrate comprising at least one dielectric layer: means for first embedded escape interconnection; means for second embedded escape interconnection; and means for surface escape interconnection, wherein the means for surface escape interconnection is located between the means for first embedded escape interconnection and the means for second embedded escape interconnection.

Aspect 12: The package of aspect 11, wherein the means for surface escape interconnection comprises an intermediate escape interconnect.

Aspect 13: The package of aspects 11 through 12, wherein the second integrated device is configured to be electrically coupled to the first integrated device through the means for first embedded escape interconnection, the means for second embedded escape interconnection and the means for surface escape interconnection.

Aspect 14: The package of aspects 11 through 13, wherein the means for first embedded escape interconnection comprises a first embedded escape pad and a first embedded trace, wherein the means for second embedded escape interconnection comprises a second embedded escape pad and a second embedded escape trace, and wherein the means for surface escape interconnection comprises a first surface escape pad and a first surface escape trace.

Aspect 15: The package of aspect 14, wherein the second integrated device is configured to be electrically coupled to the first integrated device through the first embedded escape pad, the first embedded escape trace, the second embedded escape pad, the second embedded escape trace, the first surface escape pad and the first surface escape trace.

Aspect 16: The package of aspect 15, wherein a first electrical path between the first integrated device and the second integrated device includes the first embedded escape pad and the first embedded escape trace, wherein a second electrical path between the first integrated device and the second integrated device includes the second embedded escape pad and the second embedded escape trace, and wherein a third electrical path between the first integrated device and the second integrated device includes the first surface escape pad and the first surface escape trace.

Aspect 17: The package of aspects 11 through 16, wherein a width of the means for first embedded escape interconnection, the means for second embedded escape interconnection and the means for surface escape interconnection is in a range of about 10-15 micrometers.

Aspect 18: The package of aspects 11 through 17, wherein a first spacing between the means for first embedded escape interconnection and the means for surface escape interconnection is in a first range of about 10-15 micrometers, and wherein a second spacing between the means for second embedded escape interconnection and the means for surface escape interconnection is in a second range of about 10-15 micrometers.

Aspect 19: The package of aspects 11 through 18, wherein the first integrated device includes a first chiplet and the second integrated device includes a second chiplet.

Aspect 20: The package of aspects 11 through 19, wherein a portion of the means for surface escape interconnection is located parallel to a portion of the means for first embedded escape interconnection and a portion of the means for second embedded escape interconnection, and wherein the means for surface escape interconnection is located on a different metal layer than the means for first embedded escape interconnection and the means for second embedded escape interconnection.

Aspect 21: A method for fabricating a package. The method provides a substrate comprising at least one dielectric layer; and a plurality of interconnects comprising a plurality of escape interconnects. The plurality of escape interconnects comprises a first embedded escape interconnect; a second embedded escape interconnect; and a third escape interconnect located between the first embedded escape interconnect and the second embedded escape interconnect. The method couples a first integrated device to the substrate. The method couples a second integrated device to the substrate.

Aspect 22: The method of aspect 21, wherein the second integrated device is configured to be electrically coupled to the first integrated device through the plurality of escape interconnects.

Aspect 23: The method of aspects 21 through 22, wherein a portion of the third escape interconnect is located parallel to a portion of the first embedded escape interconnect and a portion of the second embedded escape interconnect, and wherein the third escape interconnect is located on a different metal layer than the first embedded escape interconnect and the second embedded escape interconnect.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
   a substrate comprising:
      at least one dielectric layer;
      a solder resist layer coupled to and touching a surface of the at least one dielectric layer; and
      a plurality of interconnects comprising a plurality of escape interconnects, wherein the plurality of escape interconnects comprises:
         a first embedded escape interconnect located at least partially in the at least one dielectric layer, wherein the first embedded escape interconnect touches the solder resist layer, wherein the first embedded escape interconnect comprises a first embedded escape pad and a first embedded trace;
         a second embedded escape interconnect located at least partially in the at least one dielectric layer, wherein the second embedded escape interconnect touches the solder resist layer, wherein the second embedded escape interconnect comprises a second embedded escape pad and a second embedded escape trace; and a third escape interconnect located between the first embedded escape interconnect and the second embedded escape interconnect,
wherein the third escape interconnect is located on the surface of the at least one dielectric layer that touches the solder resist layer,
wherein a side surface of the third escape interconnect touches the solder resist layer, and
wherein the third escape interconnect comprises a first surface escape pad and a first surface escape trace;

a first integrated device coupled to the substrate; and
a second integrated device coupled to the substrate.

2. The package of claim 1,
wherein the third escape interconnect is located on a different metal layer than the first embedded escape interconnect and the second embedded escape interconnect,
wherein a top surface of the first embedded escape interconnect touches the solder resist layer;
wherein a top surface of the second embedded escape interconnect touches the solder resist layer; and
wherein the solder resist layer includes a different material from the at least one dielectric layer.

3. The package of claim 1, wherein the second integrated device is configured to be electrically coupled to the first integrated device through the plurality of escape interconnects.

4. The package of claim 1,
wherein the first integrated device is coupled to the first embedded escape pad through at least a first solder interconnect such that the first solder interconnect touches the first embedded escape pad,
wherein the first integrated device is coupled to the second embedded escape pad through at least a second solder interconnect such that the second solder interconnect touches the second embedded escape pad, and
wherein the first integrated device is coupled to the first surface escape pad through at least a third solder interconnect such that the third solder interconnect touches the first surface escape pad.

5. The package of claim 4, wherein the second integrated device is configured to be electrically coupled to the first integrated device through the first embedded escape pad, the first embedded escape trace, the second embedded escape pad, the second embedded escape trace, the first surface escape pad and the first surface escape trace.

6. The package of claim 5,
wherein a first electrical path between the first integrated device and the second integrated device includes the first embedded escape pad and the first embedded escape trace,
wherein a second electrical path between the first integrated device and the second integrated device includes the second embedded escape pad and the second embedded escape trace, and
wherein a third electrical path between the first integrated device and the second integrated device includes the first surface escape pad and the first surface escape trace.

7. The package of claim 1, wherein a minimum width of the first embedded escape interconnect, the second embedded escape interconnect and the third escape interconnect is in a range of about 10-15 micrometers.

8. The package of claim 1,
wherein a first minimum spacing between the first embedded escape interconnect and the third escape interconnect is in a first range of about 10-15 micrometers, and
wherein a second minimum spacing between the second embedded escape interconnect and the third escape interconnect is in a second range of about 10-15 micrometers.

9. The package of claim 1, wherein the first integrated device includes a first chiplet and the second integrated device includes a second chiplet.

10. The package of claim 1,
wherein a portion of the third escape interconnect is located parallel to a portion of the first embedded escape interconnect and a portion of the second embedded escape interconnect, and
wherein the third escape interconnect is located on a metal layer that is directly adjacent to a metal layer comprising the first embedded escape interconnect and the second embedded escape interconnect,
wherein the third escape interconnect being located between the first embedded escape interconnect and the second embedded escape interconnect means that the third escape interconnect is directly adjacent to the first embedded escape interconnect, and that the third escape interconnect is directly adjacent to the second embedded escape interconnect; and
wherein the first embedded escape interconnect, the second embedded escape interconnect and the third escape interconnect vertically overlap with the first integrated device and the second integrated device.

11. A package comprising:
a substrate comprising:
at least one dielectric layer;
a solder resist layer coupled to and touching a surface of the at least one dielectric layer;
means for first embedded escape interconnection located at least partially in the at least one dielectric layer, wherein the means for first embedded escape interconnection touches the solder resist layer, wherein the means for first embedded escape interconnection comprises a first embedded escape pad and a first embedded trace;
means for second embedded escape interconnection located at least partially in the at least one dielectric layer, wherein the means for second embedded escape interconnection touches the solder resist layer, wherein the means for second embedded escape interconnection comprises a second embedded escape pad and a second embedded escape trace; and
means for surface escape interconnection, wherein the means for surface escape interconnection is located between the means for first embedded escape interconnection and the means for second embedded escape interconnection,
wherein the means for surface escape interconnection is located on the surface of the at least one dielectric layer that touches the solder resist layer,
wherein a side surface of the means for surface escape interconnection touches the solder resist layer, and
wherein the means for surface escape interconnection comprises a first surface escape pad and a first surface escape trace;

a first integrated device coupled to the substrate; and
a second integrated device coupled to the substrate.

12. The package of claim 11,
wherein the means for surface escape interconnection comprises an intermediate escape interconnect that is located on a different metal layer than the first embedded escape interconnection and the second embedded escape interconnection, and
wherein the solder resist layer includes a different material from the at least one dielectric layer.

13. The package of claim 11, wherein the second integrated device is configured to be electrically coupled to the first integrated device through the means for first embedded escape interconnection, the means for second embedded escape interconnection and the means for surface escape interconnection.

14. The package of claim 11,
wherein the first integrated device is coupled to the first embedded escape pad through at least a first solder interconnect such that the first solder interconnect touches the first embedded escape pad,
wherein the first integrated device is coupled to the second embedded escape pad through at least a second solder interconnect such that the second solder interconnect touches the second embedded escape pad, and
wherein the first integrated device is coupled to the first surface escape pad through at least a third solder interconnect such that the third solder interconnect touches the first surface escape pad.

15. The package of claim 14, wherein the second integrated device is configured to be electrically coupled to the first integrated device through the first embedded escape pad, the first embedded escape trace, the second embedded escape pad, the second embedded escape trace, the first surface escape pad and the first surface escape trace.

16. The package of claim 15,
wherein a first electrical path between the first integrated device and the second integrated device includes the first embedded escape pad and the first embedded escape trace,
wherein a second electrical path between the first integrated device and the second integrated device includes the second embedded escape pad and the second embedded escape trace, and
wherein a third electrical path between the first integrated device and the second integrated device includes the first surface escape pad and the first surface escape trace.

17. The package of claim 11, wherein a width of the means for first embedded escape interconnection, the means for second embedded escape interconnection and the means for surface escape interconnection is in a range of about 10-15 micrometers.

18. The package of claim 11,
wherein a first spacing between the means for first embedded escape interconnection and the means for surface escape interconnection is in a first range of about 10-15 micrometers, and
wherein a second spacing between the means for second embedded escape interconnection and the means for surface escape interconnection is in a second range of about 10-15 micrometers.

19. The package of claim 11, wherein the first integrated device includes a first chiplet and the second integrated device includes a second chiplet.

20. The package of claim 11,
wherein a portion of the means for surface escape interconnection is located parallel to a portion of the means for first embedded escape interconnection and a portion of the means for second embedded escape interconnection, and
wherein the means for surface escape interconnection is located on a metal layer that is directly adjacent to a metal layer comprising the means for first embedded escape interconnection and the means for second embedded escape interconnection.

21. A method for fabricating a package, comprising:
providing a substrate comprising:
   at least one dielectric layer; and
   a solder resist layer coupled to and touching a surface of the at least one dielectric layer; and
   a plurality of interconnects comprising a plurality of escape interconnects, wherein the plurality of escape interconnects comprises:
      a first embedded escape interconnect located at least partially in the at least one dielectric layer, wherein the first embedded escape interconnect touches the solder resist layer;
      a second embedded escape interconnect located at least partially in the at least one dielectric layer, wherein the second embedded escape interconnect touches the solder resist layer; and
      a third escape interconnect located between the first embedded escape interconnect and the second embedded escape interconnect,
      wherein the third escape interconnect is located on the surface of the at least one dielectric layer that touches the solder resist layer,
      wherein a side surface of the third escape interconnect touches the solder resist layer,
      wherein a portion of the third escape interconnect is located parallel to a portion of the first embedded escape interconnect and a portion of the second embedded escape interconnect,
      wherein the third escape interconnect is located on a different metal layer than the first embedded escape interconnect and the second embedded escape interconnect,
      wherein the third escape interconnect is directly adjacent to the first embedded escape interconnect, and
      wherein the third escape interconnect is directly adjacent to the second embedded escape interconnect;
coupling a first integrated device to the substrate; and
coupling a second integrated device to the substrate.

22. The method of claim 21, wherein the second integrated device is configured to be electrically coupled to the first integrated device through the plurality of escape interconnects.

23. The method of claim 21,
wherein the first embedded escape interconnect comprises a first embedded escape pad and a first embedded trace,
wherein the second embedded escape interconnect comprises a second embedded escape pad and a second embedded escape trace, and
wherein the third escape interconnect comprises a first surface escape pad and a first surface escape trace.

* * * * *